United States Patent
Mori et al.

(10) Patent No.: US 12,002,661 B2
(45) Date of Patent: Jun. 4, 2024

(54) SUSCEPTOR HAVING COOLING DEVICE

(71) Applicant: ASM IP Holding B.V., Almere (NL)

(72) Inventors: Yukihiro Mori, Machida (JP); Melvin Verbaas, Lelystad (NL)

(73) Assignee: ASM IP Holding B.V., Almere (NL)

( * ) Notice: Subject to any disclaimer, the term of this patent is extended or adjusted under 35 U.S.C. 154(b) by 597 days.

(21) Appl. No.: 17/113,392

(22) Filed: Dec. 7, 2020

(65) Prior Publication Data
US 2021/0087680 A1   Mar. 25, 2021

Related U.S. Application Data

(60) Division of application No. 15/203,433, filed on Jul. 6, 2016, now abandoned, which is a
(Continued)

(51) Int. Cl.
H01J 37/32    (2006.01)
C23C 16/44    (2006.01)
(Continued)

(52) U.S. Cl.
CPC .. *H01J 37/32724* (2013.01); *C23C 16/45544* (2013.01); *C23C 16/4583* (2013.01); *C23C 16/4586* (2013.01); *C23C 16/46* (2013.01); *C23C 16/463* (2013.01); *C23C 16/50* (2013.01); *C23C 16/509* (2013.01); *C23C 16/52* (2013.01); *H01J 37/32009* (2013.01); *H01J 37/3244* (2013.01); *H01J 37/32715* (2013.01); *H01L 21/67103* (2013.01); *H01L 21/67109* (2013.01); *H01L 21/6719* (2013.01);
(Continued)

(58) Field of Classification Search
None
See application file for complete search history.

(56) References Cited

U.S. PATENT DOCUMENTS 5,376,213 A * 12/1994 Ueda ............... H01L 21/67126
156/345.53
5,881,208 A    3/1999 Geyling et al.
(Continued)

FOREIGN PATENT DOCUMENTS

JP    H05-057840 U    7/1993
JP    H08-107071 A    4/1996
(Continued)

OTHER PUBLICATIONS

An Office Action issued by the China National Intellectual Property Administration dated Jul. 24, 2020, which corresponds to Chinese Patent Application No. 201610607367.9 and is related to U.S. Appl. No. 15/203,433 with English language translation.
(Continued)

*Primary Examiner* — Ram N Kackar
*Assistant Examiner* — Laureen Chan
(74) *Attorney, Agent, or Firm* — Snell & Wilmer L.L.P.

(57) ABSTRACT

A susceptor includes a plate part, a first heater for heating a first portion of the plate part, a second heater for heating a second portion of the plate part, and a heat insulating portion for thermally insulating the first portion and the second portion from each other on an upper surface side of the plate part.

15 Claims, 16 Drawing Sheets
(3 of 16 Drawing Sheet(s) Filed in Color)

Related U.S. Application Data continuation-in-part of application No. 14/828,304, filed on Aug. 17, 2015, now abandoned.

(51) Int. Cl.

| | | |
|---|---|---|
| *C23C 16/455* | (2006.01) | |
| *C23C 16/458* | (2006.01) | |
| *C23C 16/46* | (2006.01) | |
| *C23C 16/50* | (2006.01) | |
| *C23C 16/509* | (2006.01) | |
| *C23C 16/52* | (2006.01) | |
| *H01L 21/67* | (2006.01) | |

(52) U.S. Cl.
CPC .... *H01L 21/67248* (2013.01); *C23C 16/4412* (2013.01); *H01J 2237/3321* (2013.01); *H01J 2237/334* (2013.01)

(56) References Cited

U.S. PATENT DOCUMENTS

| | | | |
|---|---|---|---|
| 6,469,283 B1 | 10/2002 | Burkhart et al. | |
| 2002/0137334 A1 | 9/2002 | Watanabe et al. | |
| 2002/0160560 A1 | 10/2002 | Okada et al. | |
| 2003/0160568 A1 | 8/2003 | Arai et al. | |
| 2004/0187790 A1 | 9/2004 | Bader et al. | |
| 2006/0027169 A1* | 2/2006 | Tsukamoto | C23C 16/46 118/724 |
| 2006/0076108 A1 | 4/2006 | Holland et al. | |
| 2006/0207725 A1* | 9/2006 | Oohashi | H01L 21/67109 216/58 |
| 2007/0235134 A1* | 10/2007 | Iimuro | H01L 21/68714 700/121 |
| 2008/0035306 A1* | 2/2008 | White | C23C 16/463 118/58 |
| 2010/0162956 A1* | 7/2010 | Murakami | H01L 21/67109 118/725 |
| 2015/0110974 A1 | 4/2015 | Lee et al. | |
| 2015/0340255 A1* | 11/2015 | Parkhe | H01L 21/67248 165/80.5 |
| 2016/0336190 A1 | 11/2016 | Kikuchi et al. | |
| 2017/0040191 A1 | 2/2017 | Benjaminson et al. | |

FOREIGN PATENT DOCUMENTS

| | | |
|---|---|---|
| JP | 2002-158178 A | 5/2002 |
| JP | 2010-225646 A | 10/2010 |
| JP | 2013-074031 A | 4/2013 |
| KR | 20120001661 U | 3/2012 |
| KR | 101455789 B1 | 11/2014 |
| TW | 200711029 A | 3/2007 |

OTHER PUBLICATIONS

An Office Action; "Notification of Reasons for Refusal," mailed by the Japanese Patent Office dated Jun. 23, 2020, which corresponds to Japanese Patent Application No. 2016-137240 and is related to U.S. Appl. No. 15/203,433 with English language translation.

An Office Action mailed by Taiwan Intellectual Property Office dated Feb. 11, 2020, which corresponds to Taiwanese Patent Application No. 105123385 and is related to U.S. Appl. No. 15/203,433.

An Office Action; "Notification of Reasons for Refusal," Mailed by the Japanese Patent Office dated Jan. 28, 2020, which corresponds to Japanese Patent Application No. 2016-137240 and is related to U.S. Appl. No. 15/203,433 with English language translation.

An Office Action mailed by the Taiwanese Patent Office dated Aug. 13, 2019, which corresponds to Taiwanese Patent Application No. 105123385 and is related to U.S. Appl. No. 15/203,433; with English language translation.

An Office Action mailed by the Korean Intellectual Property Office dated Dec. 22, 2022, which corresponds to Korean Patent Application No. 10-2016-0103815 and is related to U.S. Appl. No. 17/113,392; with English language translation.

An Office Action mailed by the China National Intellectual Property Administration dated Mar. 25, 2021, which corresponds to Chinese Patent Application No. 201610607367.9 and is related to U.S. Appl. No. 17/113,392; with English language translation.

\* cited by examiner

SUSCEPTOR HAVING COOLING DEVICE

CROSS-REFERENCE TO RELATED APPLICATIONS

This application is a Divisional of U.S. patent application Ser. No. 15/203,433 filed Jul. 6, 2016, which is a Continuation-in-Part of U.S. patent application Ser. No. 14/828,304 filed Aug. 17, 2015, the entire content of which is incorporated herein by reference.

BACKGROUND OF THE INVENTION

Field of the Invention

The present invention relates to a susceptor supporting a substrate and to a substrate processing apparatus provided with a susceptor.

Background Art

U.S. Pat. No. 6,469,283B1 discloses an arrangement for applying 100% of electric power to one region of a substrate supporting table having a plurality of regions and applying 50% of electric power to the other regions.

In some semiconductor or liquid crystal manufacturing processes, the temperature of a substrate is intentionally made uneven when the substrate is processed. For example, in some cases, film forming is performed on a substrate while the temperature of the substrate is made uneven, thereby making nonuniform the film thickness of a thin film formed on the substrate or making the film quality nonuniform. From the viewpoint of realizing such processing, it is preferable to create a definite temperature difference between certain different places in the substrate.

While the substrate supporting table disclosed in U.S. Pat. No. 6,469,283B1 is capable of separately heating the plurality of regions, the plurality of regions join one to another in the upper surface of the substrate supporting table. The substrate supporting table (susceptor) is generally made of a material having good heat conductivity, e.g., aluminum, aluminum nitride (AlN), carbon or silicon carbide (SiC). In the substrate supporting table disclosed in U.S. Pat. No. 6,469,283B1, therefore, transfer of heat from one zone to another is active and a definite temperature difference cannot be created between certain different places in a substrate.

SUMMARY OF THE INVENTION

In view of the above-described problem, an object of the present invention is to provide a susceptor capable of creating a definite temperature difference in a substrate and a substrate processing apparatus provided with the susceptor.

The features and advantages of the present invention may be summarized as follows.

According to one aspect of the present invention, a susceptor includes a plate part, a first heater for heating a first portion of the plate part, a second heater for heating a second portion of the plate part, and a heat insulating portion for thermally insulating the first portion and the second portion from each other on an upper surface side of the plate part.

According to another aspect of the present invention, a substrate processing apparatus includes a susceptor having a plate part, a first heater for heating a first portion of the plate part, a second heater for heating a second portion of the plate part, and a heat insulating portion for thermally insulating the first portion and the second portion from each other on an upper surface side of the plate part, a chamber in which the susceptor is housed, and an gas exhaust part attached to a side surface of the chamber. The first portion is a portion including an outer edge of the plate part, the second portion is a portion including an outer edge of the plate part, and the gas exhaust part and the first portion are opposed to each other as viewed in plan.

According to another aspect of the present invention, a substrate processing apparatus includes a susceptor having a plate part, a first heater for heating a first portion of the plate part, a second heater for heating a second portion of the plate part, and a heat insulating portion for thermally insulating the first portion and the second portion from each other on an upper surface side of the plate part, a chamber in which the susceptor is housed, and a gate valve attached to a side surface of the chamber. The first portion is a portion including an outer edge of the plate part, the second portion is a portion including an outer edge of the plate part, and the gate valve and the second portion are opposed to each other as viewed in plan.

Other and further objects, features and advantages of the invention will appear more fully from the following description.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

DETAILED DESCRIPTION OF THE PREFERRED EMBODIMENTS

Figure 1:
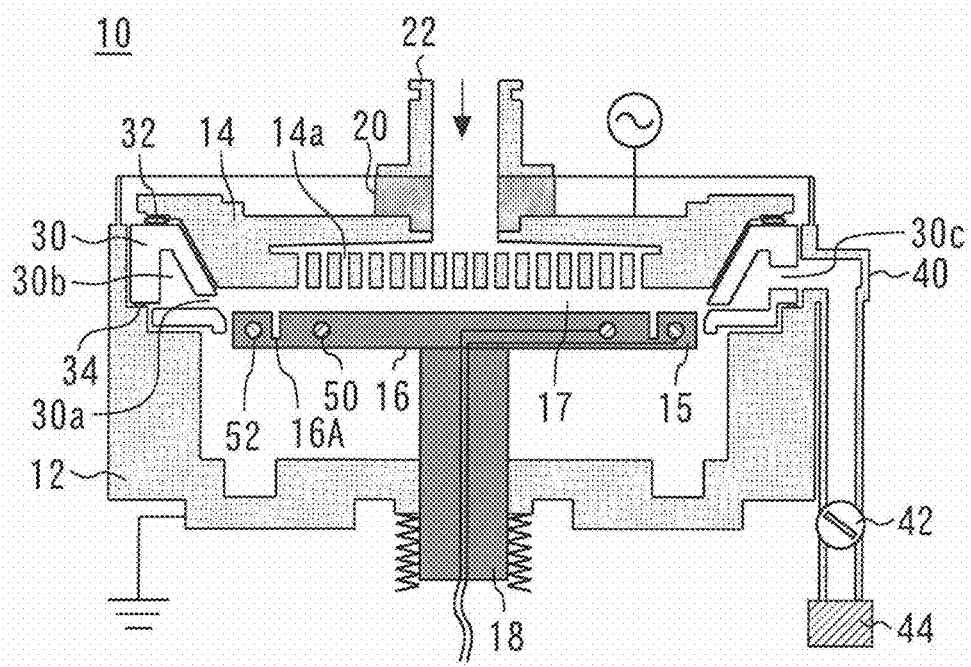
FIG. 1 is a sectional view of a substrate processing apparatus according to a first embodiment.

A susceptor and a substrate processing apparatus according to an embodiment of the present invention will be described with reference to the drawings. Components identical or corresponding to each other are assigned the same reference numerals and repeated description of them is omitted in some cases.

First Embodiment

FIG. 1 is a sectional view of a substrate processing apparatus 10 according to a first embodiment of the present invention. The substrate processing apparatus 10 is constructed as a film forming apparatus for performing, for example, plasma enhanced atomic layer deposition (PEALD) on a substrate. The substrate processing apparatus 10 has a chamber (reactor chamber) 12. A radio frequency (RF) electrode 14 to which RF power is applied is provided in the chamber 12. Slits 14a are provided in the RF electrode 14.

A susceptor 15 is provided in the chamber 12 so as to be opposed to the RF electrode 14. The susceptor 15 includes a plate part 16 and a slide shaft 18 supporting the plate part 16. The RF electrode 14 and the plate part 16 form a parallel plate structure.

A gas supply part 22 is connected to the RF electrode 14 with an insulating part 20 interposed therebetween. The gas supply part 22 is a part through which a material gas is supplied to a space between the RF electrode 14 and the susceptor 15. An exhaust duct 30 is provided between the RF electrode 14 and the chamber 12. The exhaust duct 30 is formed, for example, of a ceramic. An O-ring 32 suitably compressed is provided between the exhaust duct 30 and the RF electrode 14. An O-ring 34 suitably compressed is provided between the exhaust duct 30 and the chamber 12.

The exhaust duct 30 is formed into an annular shape as viewed in plan, such that it surrounds the plate part 16. An annular passage 30b surrounding a processing space 17 on the plate part 16 is provided by the exhaust duct 30. In the exhaust duct 30, an annular slit 30a through which a gas supplied into the processing space 17 is led into the annular passage 30b and an exhaust port 30c through which the gas in the annular passage 30b is discharged to the outside are formed.

The exhaust port 30c connects with a gas exhaust part 40 provided on a side surface of the chamber 12. The gas exhaust part 40 is provided to exhaust a material gas used for film forming. A valve 42 and a vacuum pump 44 are connected to the gas exhaust part 40. The pressure in the chamber 12 can be freely controlled by adjusting the exhaust rate with the valve 42 and the vacuum pump 44.

The thickness of the plate part 16 is, for example, 33 mm. It is preferable that the plate part 16 be formed of a material such as aluminum having good heat conductivity. In the plate part 16, a first heater 50 and a second heater 52 are embedded. The first heater 50 and the second heater 52 are each a resistance heater for example. A heat insulating portion 16A is provided between the first heater 50 and the second heater 52. The heat insulating portion 16A is a grooved portion in which a groove (gap) is provided. For the heat insulating portion 16A, a groove is provided in the upper surface of the plate part 16.

Figure 2:
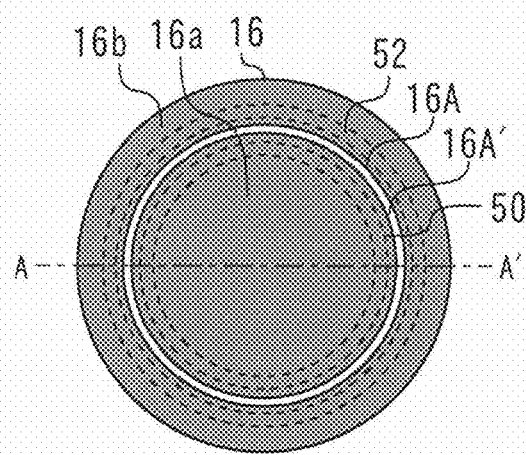
FIG. 2 is a plan view of the plate part.

FIG. 2 is a plan view of the plate part 16. The diameter of the plate part 16 is set to, for example, 325 mm to support a substrate having a diameter of 300 mm. The plate part 16 has a central portion as a first portion 16a. The first heater 50 is provided in annular form in the first portion 16a. The first heater 50 is a heater for heating the first portion 16a. The first heater 50 is indicated by a broken line. The first heater 50 has a center diameter of 180 mm for example. The center diameter is a value computed by dividing the sum of the outside diameter and the inside diameter by 2.

The plate part 16 has an outer portion as a second portion 16b. The second heater 52 is provided in annular form in the second portion 16b. The second portion 16b surrounds the first portion 16a as viewed in plan. The second heater 52 is a heater for heating the second portion 16b. The second heater 52 is indicated by a broken line. The second heater 52 has a center diameter of 280 mm for example. The first heater 50 and the second heater 52 are provided concentrically with each other.

The heat insulating portion 16A is formed in annular form as viewed in plan. The heat insulating portion 16A is formed by a side surface of the first portion 16a, a side surface of the second portion 16b distanced from the side surface of the first portion 16a and a bottom surface connecting these side surfaces. A groove 16A' is provided by the heat insulating portion 16A. The heat insulating portion 16A functions as a heat insulating portion thermally insulating the first portion 16a and the second portion 16b from each other on the upper surface side of the plate part 16. The size of the groove 16A' is, for example, a width of 1.5 mm, a depth of 23 mm and a center diameter of 247.5 mm.

Figure 3:
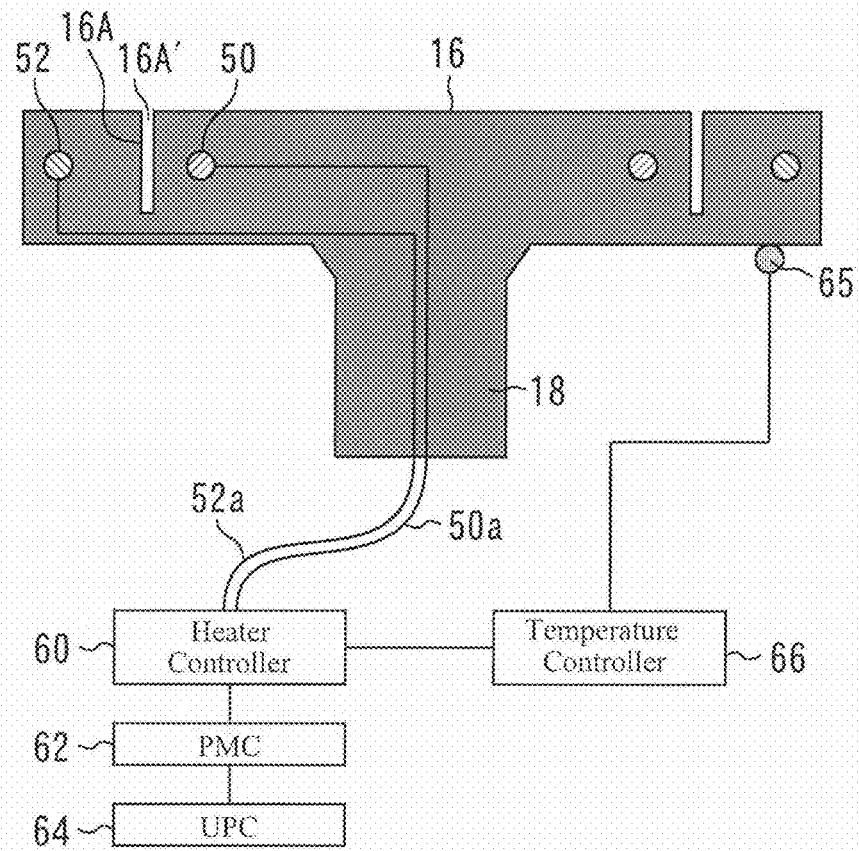
FIG. 3 is a diagram showing a method of controlling the temperature of the susceptor.

FIG. 3 is a diagram showing a method of controlling the temperature of the susceptor. The first heater 50 is connected to a heater controller 60 by wiring 50a. The second heater 52 is connected to the heater controller 60 by wiring 52a. The heater controller may be divided into two controllers for respectively controlling the first heater 50 and the second heater 52.

Wirings 50a and 52a are passed through the slide shaft 18 and extend to the outside from the lower end of the slide shaft 18. Therefore, the wirings 50a and 52a are not exposed to the interior of the chamber 12. If the wirings 50a and 52a are led from a side surface of the plate part 16 to the outside, the wirings 50a and 52a are exposed to the interior of the chamber 12 and subjected to plasma. Therefore, such a wiring layout is not preferable. Also, if the wirings 50a and 52a are led to the outside from a side surface of the plate part 16, there is a risk of the wirings 50a and 52a being damaged when the susceptor 15 is vertically moved. It is, therefore, preferable to lead out the wirings 50a and 52a from the lower end of the slide shaft 18.

A process module controller (PMC) 62 is connected to the heater controller 60. A unique platform controller (UPC) 64 is connected to the PMC 62. A temperature measuring part 65 for measuring the temperature of the susceptor 15 is attached to the plate part 16. The temperature measuring part 65 is, for example, a thermocouple. Information on the temperature measured with the temperature measuring part 65 is transmitted to a temperature controller 66. This information is used for control of the temperature of the susceptor 15.

Figure 4:
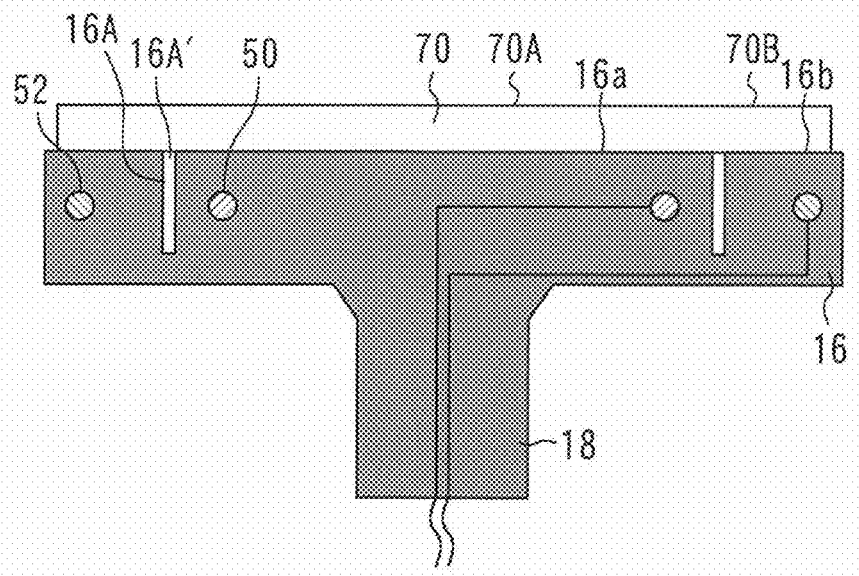
FIG. 4 is a diagram showing a substrate placed on the plate part.

A method of processing a substrate with the substrate processing apparatus 10 having the above-described susceptor 15 will be described. The vacuum pump 44 is constantly operated to maintain a vacuum in the chamber 12. A substrate to be processed is first placed on the plate part 16. FIG. 4 is a diagram showing a substrate 70 placed on the plate part 16. The substrate 70 is placed both on the first portion 16a and on the second portion 16b. The portion of the substrate 70 on the first portion 16a is referred as a substrate central portion 70A. The portion of the substrate 70 on the second portion 16b is referred to as a substrate marginal portion 70B. In the case of a substrate having a film such as $SiO_2$ film attached to its back surface, the film absorbs water and there is a possibility of the substrate sliding when placed on the heated susceptor. It is thus preferable to provide a shallow groove for receiving the substrate 70 in the upper surface of the plate part 16 to ensure that the substrate does not slide on the plate part 16. A small projection may alternatively be provided on the upper surface of the plate part 16, and the side surface of the substrate may be caused to abut against the projection in order to prevent the substrate from sliding.

Subsequently, the substrate 70 is heated. In a recipe in which conditions for processing the substrate 70 are described, a target temperature of the first portion 16a and a target temperature of the second portion 16b are set. The heater controller 60 energizes the first heater 50 and the second heater 52 based on this setting so that the first portion 16a and the second portion 16b has the target temperatures. For example, the first portion 16a has a temperature of 300° C. and the second portion 16b has a temperature of 305° C.

At this time the groove 16A' functions as a heat insulating layer because the groove 16A' has a vacuum therein. With the heat insulating portion 16A (groove 16A'), transfer of heat between the first portion 16a and the second portion 16b can be limited on the upper surface side of the plate part 16. That is, since the first portion 16a and the second portion 16b are thermally insulated from each other on the upper surface side of the plate part 16 by the heat insulating portion 16A, a definite temperature difference can be created on the upper surface side of the plate part 16.

Figure 5:
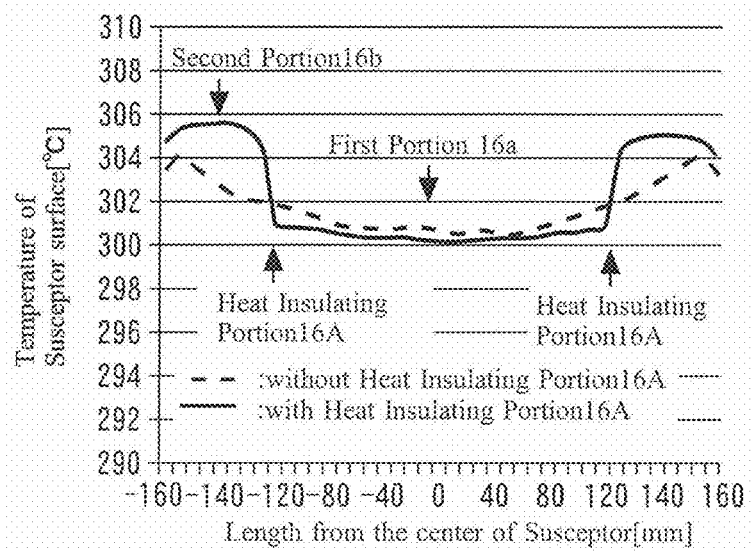
FIG. 5 is a graph showing the temperature of the susceptor surface.

FIG. 5 is a graph showing the temperature of the susceptor surface. A solid line indicates the surface temperature of the plate part 16 according to the first embodiment of the present invention. More specifically, the solid line indicates a temperature distribution along line A-A' in FIG. 2. For the first portion 16a, the temperature in accordance with the setting in the recipe (300° C.) was substantially realized. Also for the second portion 16b, the temperature in accordance with the setting in the recipe (305° C.) was substantially realized. Moreover, the provision of the heat insulating portion 16A for thermally insulating the first portion 16a and the second portion 16b on the upper surface side of the plate part 16 enabled creating a definite temperature difference between the first portion 16a and the second portion 16b.

On the other hand, a broken line in FIG. 5 indicates the temperature of a susceptor surface according to a comparative example. The susceptor according to the comparative example is generally the same as the susceptor according to the first embodiment of the present invention but differs in that the heat insulating portion is not provided. Since no heat insulating portion exists in the plate part of the susceptor according to the comparative example, heat transfers between the first portion (central portion) and the second portion (marginal portion) on the upper surface side of the plate part. Therefore, the temperature distribution in the susceptor surface in the comparative example is such that the temperature increases gradually along a direction from the center toward the outer edge of the plate part. That is, a definite temperature difference cannot be created in the plate part.

The definite temperature difference created in the plate part 16 according to the first embodiment is reflected in the temperature of the substrate 70 placed on the plate part 16. That is, in the substrate 70 shown in FIG. 4, the temperature of the substrate central portion 70A is 300° C. and the temperature of the substrate marginal portion 70B is 305° C. After the substrate 70 is thus set to the predetermined temperatures, a material gas is supplied into the chamber 12 to perform plasma film forming on the substrate 70.

In ordinary substrate processing, a sequence of process steps consisting of forming a film on the substrate, forming a pattern by exposure and development, and removing unnecessary portions by etching are repeatedly executed. Ideal substrate processing is a process in which a film is formed with no in-plane nonuniformity, a pattern is formed with no in-plane nonuniformity, and etching is performed with no in-plane nonuniformity. For example, in the etching step, there is a possibility of in-plane nonuniformity of the amount of etching. In such a case, the in-plane nonuniformity should be inhibited by adjusting conditions for the etching step. In some cases, however, such adjustment is impossible or difficult to perform.

In some cases, therefore, a demand is made for intentionally making nonuniform the film quality or film thickness of the film formed in the film forming step in order to absorb an in-plane nonuniformity of the amount of etching. For example, in some cases, if the amount of etching on the outer edge side of the substrate is relatively increased by etching, film forming is performed so that the thickness is increased on the substrate outer edge side.

The susceptor and the substrate processing apparatus according to the first embodiment of the present invention are capable of creating a definite temperature difference in the substrate, as described above, and are, therefore, suitable for intentionally making the film thickness or film quality of the film nonuniform. Consequently, a nonuniformity as a result of the entire process can be removed by forming a film having any desirable nonuniformity to absorb an in-plane nonuniformity other than a nonuniformity in the film forming step. That is, an in-plane nonuniformity at the end of the process can be limited.

The distribution of the film thickness of the film to be formed and the distribution of the film quality are set as desired according to conditions needed from steps other than the film forming step. For example, a film thicker (or thinner) than a film on the substrate central portion is formed on the substrate marginal portion, or a film formed on the substrate marginal portion is made harder (or softer) than a film formed on the substrate central portion.

In the case of plasma film forming, the electric field intensity is increased at the substrate central portion and is reduced at the substrate marginal portion due to the contribution of the chamber. Also, in plasma film forming, the film thickness on a portion at which the substrate temperature is low ordinarily becomes higher than that of a portion at which the substrate temperature is high. A definite temperature difference is created in the substrate by comprehensively considering factors contributing to the in-plane distribution of the film thickness or film quality to form a film having an in-plane nonuniformity which meets a demand.

The susceptor 15 and the substrate processing apparatus 10 according to the first embodiment of the present invention can be variously modified. Determination as to which portion of the film is to be made harder (or softer) or which portion is to be made thicker (or thinner) is suitably made to meet a demand from a step other than the film forming step. The susceptor and the substrate processing apparatus according to the present invention can be constructed not only as the film forming apparatus but also as an etcher. The film forming apparatus and an etcher have a commonality in being a plasma process in a vacuum.

From the viewpoint of equalization between the temperature distribution realized in the plate part 16 and the temperature distribution in the substrate 70, it is preferable that the substrate 70 be in close contact with the plate part 16. It is, therefore, preferable to maintain the substrate 70 in close contact with the plate part 16 with an electrostatic chuck provided on the plate part 16. The change in temperature of the susceptor 15 due to contact between the substrate 70 and the susceptor 15 is small because the heat capacity of the susceptor 15 is larger than that of the substrate 70.

In the recipe, setting of a temperature difference between the first portion 16a and the second portion 16b may be made instead of setting of both target temperatures of the two portions. For example, target temperatures of the first and second portions 16a and 16b may be set in such a manner that the target temperature of the first portion 16a is set in the recipe and the target temperature of the second portion 16b is defined as the result of addition of a predetermined temperature (e.g., 50° C.) to the target temperature of the first portion 16a or subtraction of a predetermined temperature from the target temperature of the first portion 16a.

The pattern of the heat insulating portion 16A can be changed as desired according to the required temperature distribution in the substrate. The size of the groove 16A' and other values shown in the first embodiment is only an example and can be changed as desired. Modifications thus made can also be applied as desired to susceptors and substrate processing apparatuses according to other embodiments described below. The susceptors and substrate processing apparatuses according to the embodiments described below have a number of commonalities with those in the first embodiment and will therefore be described mainly with respect to points of difference from the first embodiment.

Second Embodiment

Figure 6:
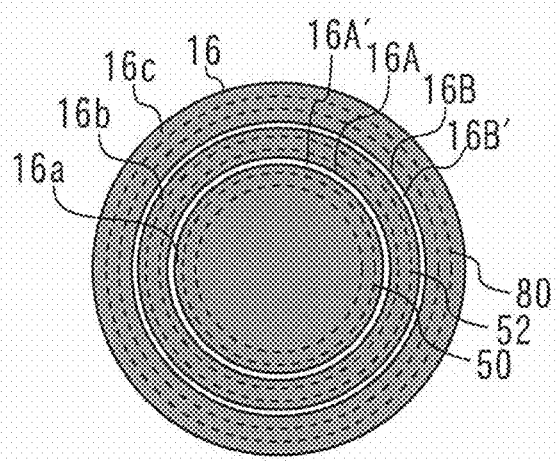
FIG. 6 is a plan view of the susceptor according to the second embodiment.

FIG. 6 is a plan view of the susceptor according to the second embodiment. A third portion 16c is formed as a portion of the plate part 16. The third portion 16c surrounds the second portion 16b as viewed in plan. A third heater 80 for heating the third portion 16c is embedded in the third portion 16c. The third heater 80 is indicated by a broken line.

The first heater 50, the second heater 52 and the third heater 80 are provided concentrically with each other.

An outer heat insulating portion 16B is provided in the plate part 16 on the upper surface side. The outer heat insulating portion 16B is formed by a side surface of the second portion 16b, a side surface of the third portion 16c distanced from the side surface of the second portion 16b and a bottom surface connecting these side surfaces. The outer heat insulating portion 16B provides a groove 16B' which functions as a heat insulating layer. The groove 16B' thermally insulates the second portion 16b and the third portion 16c from each other on the upper surface side of the plate part 16.

With the susceptor according to the second embodiment of the present invention, the temperatures of the first portion 16a, the second portion 16b and the third portion 16c can be independently set to desired temperatures. The degree of freedom of the temperature distribution in the substrate can therefore be improved in comparison with that in the susceptor according to the first embodiment in which the plate part is divided into two on the upper surface side for temperature control.

Third Embodiment

Figure 7:
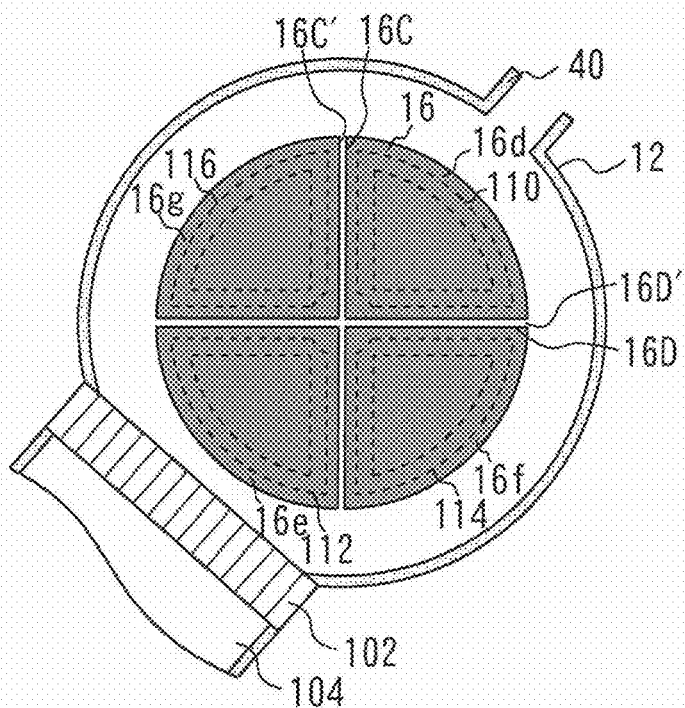
FIG. 7 is a plan view of the substrate processing apparatus according to the third embodiment.

FIG. 7 is a plan view of the substrate processing apparatus according to the third embodiment. Of the chamber 12, only the side wall portion is illustrated so that the interior of the chamber 12 can be seen. In the chamber 12, the susceptor is housed. FIG. 7 shows the plate part 16. A gas exhaust part 40 is attached to a side surface of the chamber 12 for the purpose of evacuating the chamber 12 and exhausting a material gas supplied into the chamber 12. A gate valve 102 is attached to a side surface of the chamber 12 for the purpose of putting a substrate in the chamber 12 and taking out the substrate from the chamber 12. A wafer handling chamber 104 is connected to the gate valve 102.

The plate part 16 of the susceptor has a first portion 16d, a second portion 16e, a third portion 16f and a fourth portion 16g. Each of the first to forth portions 16d, 16e, 16f, and 16g is sectoral as viewed in plan. The first to forth portions 16d, 16e, 16f, and 16g are portions including the outer edge of the plate part 16. The gas exhaust part 40 and the first portion 16d are opposed to each other as viewed in plan. The gate valve 102 and the second portion 16e are opposed to each other as viewed in plan. Thus, the first portion 16d is a region in the plate part 16 closer to the gas exhaust part 40, while the second portion 16e is a region in the plate part 16 closer to the gate valve 102.

In the plate part 16, heat insulating portions 16C and 16D are formed, which are grooved portions. For the heat insulating portion 16C, a groove 16C' is provided between the first portion 16d and the fourth portion 16g and between the second portion 16e and the third portion 16f. For the heat insulating portion 16D, a groove 16D' is provided between the first portion 16d and the third portion 16f and between the second portion 16e and the fourth portion 16g. For the heat insulating portions 16C and 16D, grooves forming a crisscross pattern are provided in the plate part 16. The width and depth of the grooves 16C' and 16D', not particularly specified, are substantially the same as those of the grooves described in the description of the first embodiment.

A first heater 110 for heating the first portion 16d is embedded in the first portion 16d. A second heater 112 for heating the second portion 16e is embedded in the second portion 16e. A third heater 114 for heating the third portion 16f is embedded in the third portion 16f. A fourth heater 116 for heating the fourth portion 16g is embedded in the fourth portion 16g. The first to fourth heaters 110, 112, 114, and 116 are individually controlled with the heater controller. Under the control of the heater controller, therefore, the first to fourth portions 16d, 16e, 16f, and 16g can have different temperatures. The first to fourth portions 16d, 16e, 16f, and 16g are thermally separated from each other on the upper surface side of the plate part 16 by the heat insulating portions 16C and 16D, thus enabling creating definite temperature differences in the substrate.

When a gas in the chamber 12 is exhausted (evacuated), the interior of the chamber 12 is not uniformly evacuated. The pressure in a place near the gas exhaust part 40 is lower than the pressure in a place remote from the gas exhaust part 40. In an area where the pressure is low, the gas stay time (the time period during which one molecule stays in plasma) is reduced. In many cases of processing in film forming apparatuses or etchers, therefore, the film forming speed is reduced in a place near the gas exhaust part 40 in the film forming apparatus, or the etching speed is reduced in a place near the gas exhaust part 40 in the etcher.

The susceptor 15 and the chamber 12 are at the same potential (ground). At the time of plasma generation, main discharge from the RF electrode 14 to the closest electrode (the plate part 16 of the susceptor 15) occurs. However, discharge from the RF electrode 14 to portions including the chambers not originally supposed to function as an electrode also occurs. From the viewpoint of preventing film forming conditions becoming uneven in the substrate plane, it is preferable that the chamber 12 surrounds the RF electrode 14, and that the distance from the RF electrode 14 are uniform with respect to all directions. In actuality, however, the distance from the RF electrode 14 to the electrodes at the ground potential and the electrode shapes are not uniform because of the gate valve 102. That is, the way of spreading of plasma in the vicinity of the gate valve 102 and the way of spreading in a place remote from the gate valve 102 are different from each other.

Thus, film forming conditions in an area near the gas exhaust part 40 and film forming conditions in an area remote from the gas exhaust part 40 are different from each other and film forming conditions in an area near the gate valve 102 and film forming conditions in an area remote from the gate valve 102 are also different from each other. That is, even between two points at the same distance from the substrate center, the film forming conditions are changed depending on the distances of the points from the gas exhaust part 40 and the gate valve 102.

Therefore, the susceptor according to the third embodiment of the present invention is designed so that the first portion 16d opposed to the gas exhaust part 40 can be independently temperature-controlled. The temperature of the first portion 16d is set in consideration of the specialty of film forming conditions at the first portion 16d, thus enabling control of the film thickness and film quality of a film formed on the substrate on the first portion 16d.

Further, the susceptor is designed so that the second portion 16e opposed to the gate valve 102 can be independently temperature-controlled. The temperature of the second portion 16e is set in consideration of the specialty of film forming conditions at the second portion 16e, thus enabling control of the film thickness and film quality of a film formed on the substrate on the second portion 16e.

In a case where the influence of the existence of the gate valve 102 on the film forming quality is small, opposing the gas exhaust part 40 and the first portion 16d suffices and the second portion 16e is not necessarily opposed to the gate valve 102. Also, in a case where the influence of the existence of the gas exhaust part 40 on the film forming quality is small, opposing the gate valve 102 and the second portion 16e suffices and the first portion 16d is not necessarily opposed to the gas exhaust part 40. The positions of the gate valve 102 and the gas exhaust part 40 are not necessarily in a symmetric relationship with each other. Also, the plate part 16 may be divided into three portions or five or more portions by heat insulating portions.

Fourth Embodiment

Figure 8:
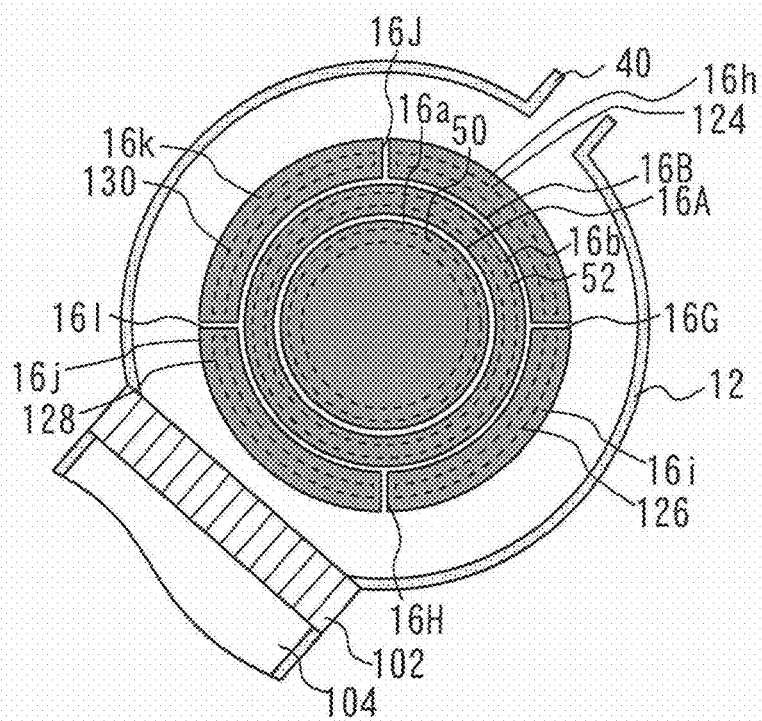
FIG. 8 is a plan view of the substrate processing apparatus according to the fourth embodiment.

FIG. 8 is a plan view of the substrate processing apparatus according to the fourth embodiment. The first portion 16a, the second portion 16b, and heat insulating portion 16A and the outer heat insulating portion 16B are provided in the same way as those of the plate part 16 in the second embodiment (FIG. 6). In the fourth embodiment of the present invention, the third portion 16c in the second embodiment is divided into four. That is, as shown in FIG. 8, four third portions 16h, 16i, 16j, and 16k are provided as portions of the plate part 16. The four third portions 16h, 16i, 16j, and 16k as a whole surround the second portion 16b as viewed in plan. The third portion 16h is opposed to the gas exhaust part 40. The third portion 16j is opposed to the gate valve 102.

A third heater 124 for heating the third portion 16h is embedded in the third portion 16h. A third heater 126 for heating the third portion 16i is embedded in the third portion 16i. A third heater 128 for heating the third portion 16j is embedded in the third portion 16j. A third heater 130 for heating the third portion 16k is embedded in the third portion 16k. Thus, one third heater is provided in each of the plurality of third portions. The four third heaters 124, 126, 128, and 130 are individually controlled by the heater controller. The four third portions 16h, 16i, 16j, and 16k can therefore be controlled by the heater controller to have different temperatures.

The outer heat insulating portion 16B, which is a grooved portion, is formed in the plate part. The outer heat insulating portion 16B thermally insulates the second portion 16b and the plurality of third portions 16h, 16i, 16j, and 16k from each other on the upper surface side of the plate part. Further, outer-edge-side heat insulating portions 16G, 16H, 16I, and 16J, which are grooved portions, are formed in the plate part. The outer-edge-side heat insulating portions 16G, 16H, 16I, and 16J thermally insulate the plurality of third portions from each other on the upper surface side of the plate part. The first portion 16a, the second portion 16b, and the plurality of third portions 16h, 16i, 16j, and 16k are thermally separated from each other on the upper surface side of the plate part by the heat insulating portion 16A, the outer heat insulating portion 16B and the outer-edge-side heat insulating portions 16G, 16H, 16I, and 16J, thus enabling creating definite temperature differences in the substrate.

In some cases, the influence of the existence of the gas exhaust part 40 on film forming conditions are particularly large at an edge portion of the substrate near the gas exhaust part 40 and is small at a central portion of the substrate. In the fourth embodiment of the present invention, therefore, independent temperature control of the third portion 16h opposed to the gas exhaust part 40 at an outer edge portion of the plate part is enabled. The temperature of the third portion 16h is set in consideration of the specialty of film forming conditions at the third portion 16h, thus enabling control of the film thickness and film quality of a film formed on the substrate on the third portion 16h.

Also, in some cases, the influence of the existence of the gate valve 102 on film forming conditions are particularly large at an edge portion of the substrate near the gate valve 102 and is small at a central portion of the substrate. In the fourth embodiment of the present invention, therefore, independent temperature control of the third portion 16j opposed to the gate valve 102 at an outer edge portion of the plate part is enabled. The temperature of the third portion 16j is set in consideration of the specialty of film forming conditions at the third portion 16j, thus enabling control of the film thickness and film quality of a film formed on the substrate on the third portion 16j.

Since the first heater 50, the second heater 52 and the plurality of third heaters 124, 126, 128, and 130 are provided concentrically with each other, temperature settings can be made in consideration of changes in film forming conditions dependent on the distance from the center of the plate part (center-edge relationship) in the same way as in the susceptor in the second embodiment. That is, with the susceptor and the substrate processing apparatus according to the fourth embodiment of the present invention, a film thickness distribution and a film quality distribution selected as desired can be realized while correcting the center-edge relationship, the influence of the existence of the gas exhaust part 40 and the influence of the existence of the gate valve 102.

The number of third portions is not limited to four. A plurality of third portions may be used. If the number of portions which can be independently temperature-controlled is increased, for example, by increasing the number of grooved portions and freely changing the shapes of grooved portions, a complicated film thickness distribution or film quality distribution can be realized.

Fifth Embodiment

Figure 9:
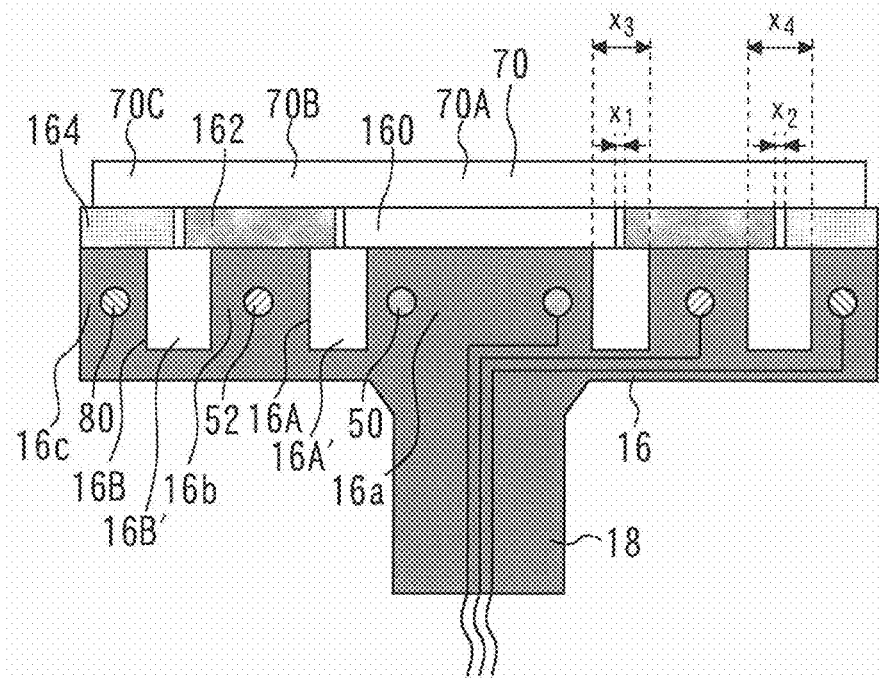
FIG. 9 is a sectional view of a susceptor and other members according to the fifth embodiment.

FIG. 9 is a sectional view of a susceptor and other members according to the fifth embodiment. This susceptor is similar to the susceptor according to the second embodiment (FIG. 6). However, the widths of the grooves 16A' and 16B' formed in the heat insulating portion 16A and the outer heat insulating portion 16B are larger than those in the second embodiment. Also, a first closing part 160 is provided on the first portion 16a. The first closing part 160 closes part of the groove 16A' in the grooved portion without contacting the second portion 16b. The shape (planar shape) of the first closing part 160 as viewed in plan is circular. A second closing part 162 is provided on the second portion 16b. The second closing part 162 closes part of the groove 16A' in the grooved portion and part of the groove 16B' without contacting the first portion 16a and the first closing part 160. The planer shape of the second closing part 162 is annular, surrounding the first closing part 160.

A third closing part 164 is provided on the third portion 16c. The third closing part 164 closes part of the groove 16B' without contacting the second portion 16b and the second closing part 162. The planer shape of the third closing part 164 is annular, surrounding the second closing part 162. The substrate 70 to be processed is placed on the first closing part 160, the second closing part 162 and the third closing part 164. The material of the first to third closing parts 160, 162, and 164 is not particularly specified, if it does not largely impede plasma discharge. The material may be, for example, a ceramic or Al.

The effect of thermally insulating the first portion 16a and the second portion 16b from each other and the effect of thermally insulating the second portion 16b and the third portion 16c from each other can be improved by increasing the width (x3) of the groove 16A' and the width (x4) of the groove 16B'. However, if the substrate is heated while being directly placed on the plate part having the width (x3) of the groove 16A' and the width (x4) of the groove 16B' increased, then the substrate temperature is not sufficiently increased at the positions right above the grooves 16A' and 16B'. That is, unintended temperature variation occurs.

To prevent this, the first to third closing parts 160, 162, and 164 are provided. The first closing part 160 and the second closing part 162 close part of the groove 16A'. Therefore the distance (x1) between the first closing part 160 and the second closing part 162 is smaller than the width (x3) of the groove 16A'. The second closing part 162 and the third closing part 164 close part of the groove 16B'. Therefore the distance (x2) between the second closing part 162 and the third closing part 164 is smaller than the width (x4) of the groove 16B'. Consequently, unintended temperature variation can be limited in comparison with the case where the substrate is directly placed on the plate part 16.

It is preferable to change the number of closing parts according to the number of grooves formed in the plate part. For example, a case where only the groove 16A' is formed in the plate part, the third closing part 164 is not provided.

Sixth Embodiment

Figure 10:
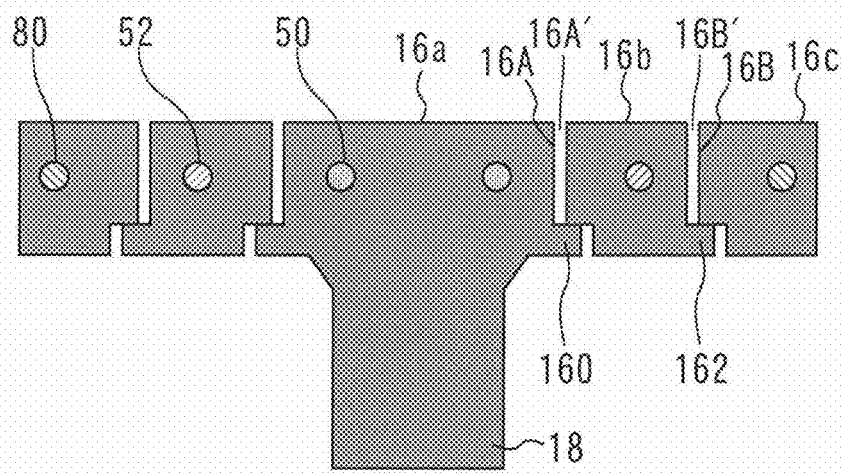
FIG. 10 is a sectional view of a susceptor according to the sixth embodiment.

FIG. 10 is a sectional view of a susceptor according to the sixth embodiment. The first portion 16a, the second portion 16b and the third portion 16c are separate parts. In other words, the third portion 16c can be detached from the second portion 16b. The second portion 16b can be detached from the first portion 16a. The second portion 16b and the third portion 16c are annular parts as viewed in plan. A projection 160 is provided on a side surface of the first portion 16a, and the second portion 16b is put on this projection 160. A projection 162 is provided on a side surface of the second portion 16b, and the third portion 16c is put on this projection 162.

The grooved portion (heat insulating portion 16A) is formed by the side surface of the first portion 16a, an upper surface of the projection 160, and a side surface of the second portion 16b. The outer heat insulating portion 16B is formed by the side surface of the second portion 16b, an upper surface of the projection 162 and a side surface of the third portion 16c.

As is apparent from FIG. 10, the deep groove 16A' can be provided by providing the projection 160 at the lower end of the side surface of the first portion 16a and by reducing the thickness of the projection 160. The deep groove 16B' can be provided by providing the projection 162 at the lower end of the side surface of the second portion 16b and by reducing the thickness of the projection 162. If the groove is made deep in the susceptor in the first embodiment, there is an apprehension that the strength of the susceptor is considerably reduced. However, the susceptor according to the sixth embodiment of the present invention is capable of securing the strength while making the groove deep, since it is of an assembly type.

Seventh Embodiment

Figure 11:
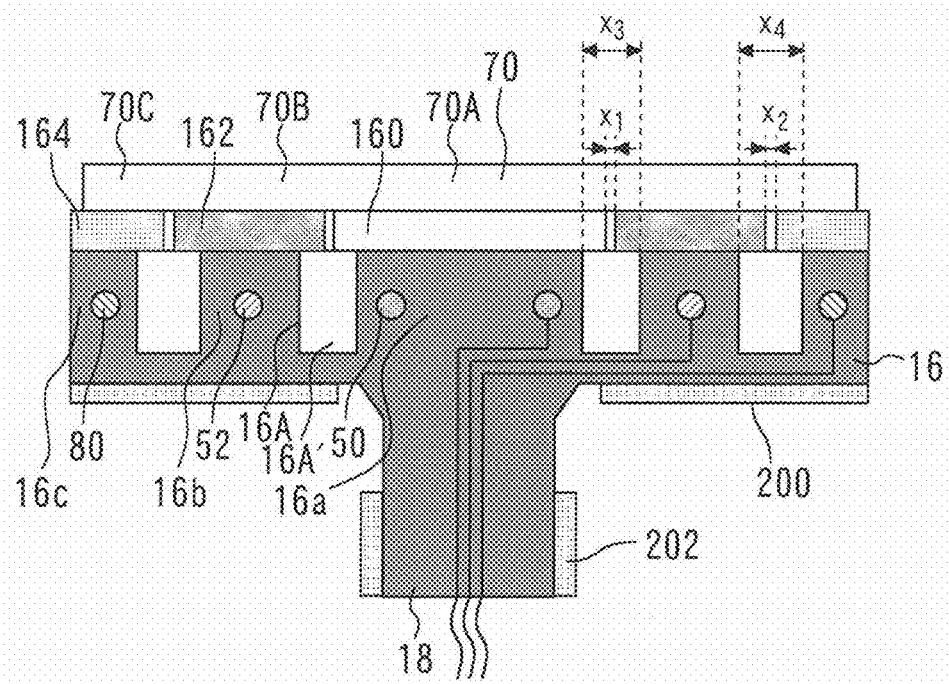
FIG. 11 is a sectional view of a susceptor and other members according to the seventh embodiment.

FIG. 11 is a sectional view of a susceptor and other members according to the seventh embodiment. This susceptor has a cooling member 200 attached to the plate part 16, and a cooling member 202 attached to the slide shaft 18. The cooling members 200 and 202 are not particularly specified, if a well-known cooling method is used. The cooling member 200 is attached right below the grooved portions of the plate part 16 (heat insulating portion 16A and outer heat insulating portion 16B). The degrees of cooling by the cooling members 200 and 202 are controlled by the heater controller.

For example, when plasma is caused to arise at 1 kW, the temperature of the susceptor is increased to a certain degree by RF energy. In some cases, this temperature rise makes it difficult to realize a low-temperature process. In the susceptor according to the seventh embodiment of the present invention, therefore, the susceptor is cooled with the cooling members 200 and 202 to limit the rise in temperature of the susceptor, thereby enabling a low-temperature process to be realized.

On the upper surface side of the plate part, the first portion 16a, the second portion 16b and the third portion 16c are thermally separated from each other. On the lower surface side of the plate part, however, these portions are not thermally separated from each other. Therefore, heat transfer between the first to third portions 16a, 16b, and 16c occurs mainly on the lower surface side of the plate part. In the susceptor according to the seventh embodiment of the present invention, the cooling member 200 is provided on the lower surface side of the plate part 16 to limit this heat transfer. More specifically, the cooling member 200 is provided right below the grooved portions (heat insulating portion 16A and outer heat insulating portion 16B), thereby enabling limiting of heat transfer between the first portion 16a and the second portion 16b and heat transfer between the second portion 16b and the third portion 16c. The cooling member 200 may be embedded in the plate part 16, and the cooling member 202 may be embedded in the slide shaft 18.

Eighth Embodiment

Figure 12:
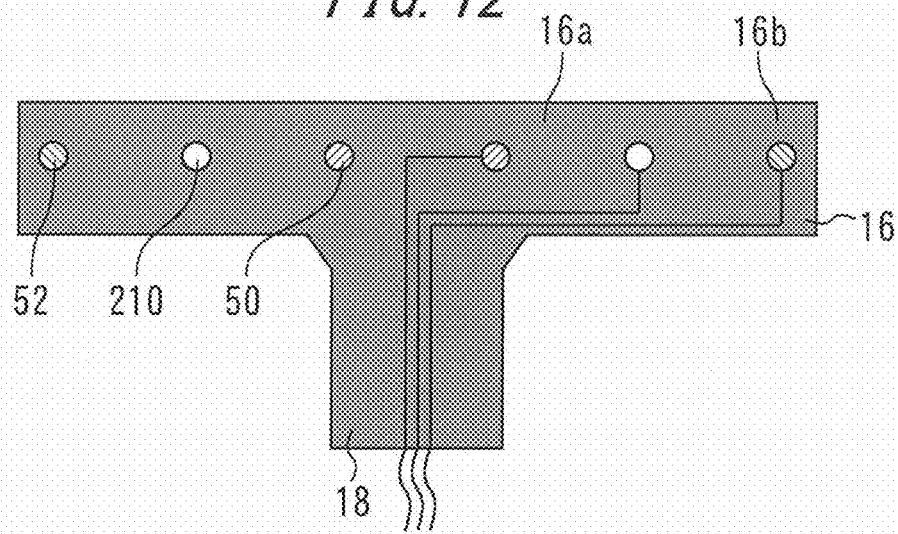
FIG. 12 is a sectional view of a susceptor according to the eighth embodiment.

FIG. 12 is a sectional view of a susceptor according to the eighth embodiment. In the first to seventh embodiments, the grooved portion is provided in the plate part on the upper surface side as a heat insulating portion for thermally insulating the first portion and the second portion of the plate part from each other. However, a heat insulating portion in the eighth embodiment is a cooling device 210 provided in the plate part 16. The degree of cooling with the cooling device 210 is controlled by the heater controller. A first heater 50 and a second heater 52 are operated while the cooling device 210 is operated. Then the first portion 16a and the second portion 16b are thermally insulated from each other by cooling with the cooling device 210. It is preferable to thermally insulate the first portion 16a and the second portion 16b particularly on the upper surface side of the plate part 16. Thermal insulation of the first portion 16a and the second portion 16b enables creating a definite temperature difference in the substrate without providing any groove. A suitable combination of the embodiments described above may be made and used.

According to the present invention, certain different regions in the susceptor are thermally insulated from each other by a heat insulating portion, thus enabling creating a definite temperature difference.

Ninth Embodiment

Figure 13:
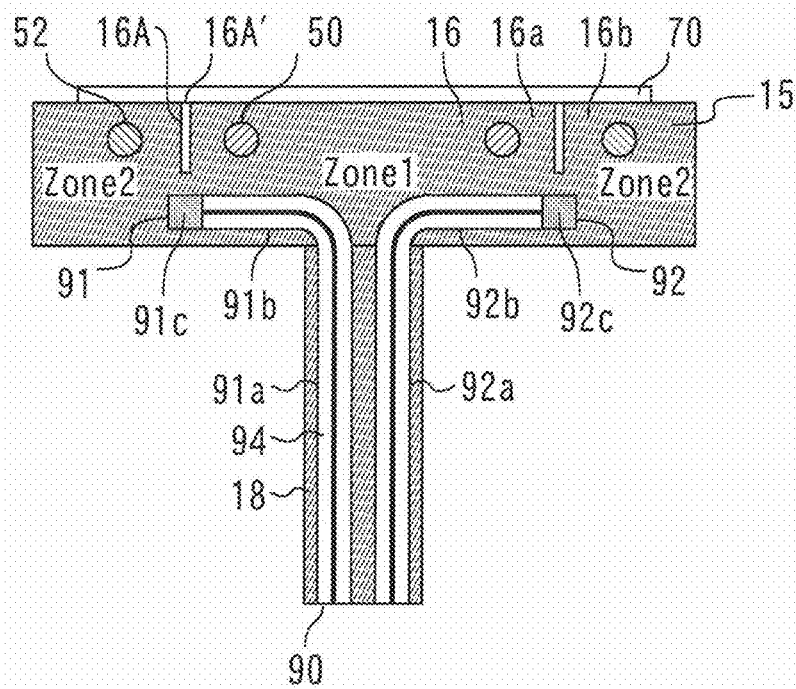
FIG. 13 is a sectional view of a susceptor according to the ninth embodiment.

FIG. 13 is a sectional view of a susceptor according to the ninth embodiment of the present invention. A cooling device 90 for cooling the grooved portion 16A provided in the plate part 16 on the upper surface side as a portion for thermally insulating the first portion 16a and the second portion 16b from each other and a portion of the plate part 16 right below the groove 16A' along the grooved portion 16A is provided. The cooling device 90 has cooling medium passages 91 and 92 in two lines. Flows of a cooling medium are formed separately from each other in the cooling medium passages 91 and 92. The temperature of the cooling medium is not particularly specified. The temperature of the cooling medium is, for example, about 20° C.

The cooling medium passage 91 includes a vertical cooling medium passage 91a extending generally vertically, a first cooling medium passage 91b connecting to the vertical cooling medium passage 91a, and a second cooling medium passage 91c connecting to the first cooling medium passage 91b. The vertical cooling medium passage 91a is provided as a cooling medium passage through which the cooling medium flows generally vertically in the slide shaft 18 and the first portion 16a. The first cooling medium passage 91b extends through the first portion 16a. The second cooling medium passage 91c extends through a portion of the plate part 16 immediate below the groove 16A'.

The cooling medium passage 92 includes a vertical cooling medium passage 92a extending generally vertically, a first cooling medium passage 92b connecting to the vertical cooling medium passage 92a, and a second cooling medium passage 92c connecting to the first cooling medium passage 92b. The vertical cooling medium passage 92a is provided as a cooling medium passage through which the cooling medium flows generally vertically in the slide shaft 18 and the first portion 16a. The first cooling medium passage 92b extends through the first portion 16a. The second cooling medium passage 92c extends through a portion of the plate part 16 immediate below the groove 16A'.

Each of black thick lines in the vertical cooling medium passages 91a and 92a and the first cooling medium passages 91b and 92b indicates a pipe through which the cooling medium flows. This pipe is surrounded by a hollow 94 so that the cooling medium does not contact the plate part 16 and the slide shaft 18. The hollow 94 hinders heat transfer between the cooling medium and the plate part 16 and between the cooling medium and the slide shaft 18. In the vertical cooling medium passages 91a and 92a and the first cooling medium passages 91b and 92b, therefore, the cooling medium does not contact the plate part 16 and the slide shaft 18 to have an increase in its temperature. A component other than the hollow 94 may be adopted as a heat transfer inhibiting part for hindering heat transfer between the cooling medium and the plate part 16 and between the cooling medium and the slide shaft 18.

On the other hand, in the second cooling medium passages 91c and 92c, the cooling medium and the plate part 16 contact each other. Therefore, the portion of the plate part 16 right below the groove 16A' is cooled by the cooling medium.

Figure 14:
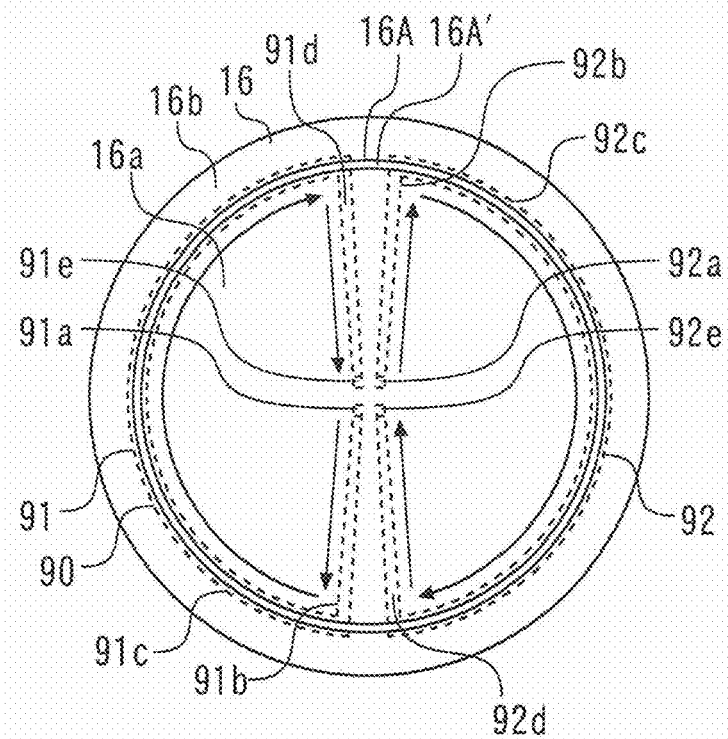
FIG. 14 is a plan view of the susceptor shown in FIG. 13.

FIG. 14 is a plan view of the susceptor 15 shown in FIG. 13. The cooling medium passages 91 and 92 are indicated by broken lines for ease of description. Flows of the cooling medium will be described with reference to FIG. 14. Arrows in FIG. 14 indicate directions in which the cooling medium flows. First, the cooling medium having passed through the vertical cooling medium passage 91a reaches the first cooling medium passage 91b. The cooling medium then passed through the first cooling medium passage 91b to advance from the center portion of the first portion 16a to the position right below the grooved portion 16A and to reach the second cooling medium passage 91c. In the vertical cooling medium passage 91a and the first cooling medium passage 91b, the temperature of the cooling medium is not substantially increased since the cooling medium and the susceptor 15 do not contact each other.

The cooling medium having reached the inlet of the second cooling medium passage 91c advances so as to depict a semicircle below the groove 16A' and reaches a third cooling medium passage 91d, which is a passage extending from a position right below the grooved portion 16A to the center of the first portion 16a. The cooling medium having advanced through the third cooling medium passage 91d reaches a vertical cooling medium passage 91e, which provides a vertical cooling medium passage in plate part 16 and the slide shaft 18, similarly to the vertical cooling medium passage 91a. The cooling medium flows downward through the vertical cooling medium passage 91e to be discharged to the outside. A heat transfer inhibiting part for hindering heat transfer between the cooling medium and the plate part 16 and between the cooling medium and the slide shaft 18 is provided in the third cooling medium passage 91d and the vertical cooling medium passage 91e, as is that in the vertical cooling medium passage 91a and the first cooling medium passage 91b. In the third cooling medium passage 91d and the vertical cooling medium passages 91e, therefore, substantially no increase in temperature of the cooling medium occurs as a result of passage of the cooling medium through the third cooling medium passage 91d and the vertical cooling medium passages 91e.

Thus, the cooling medium passage 91 is provided for cooling through a semicircular region right below the grooved portion 16A provided in annular form as viewed in plan.

Flows of the cooling medium in the cooling medium passage 92 that is different passage from cooling medium passage 91 will be described. First, the cooling medium having passed through the vertical cooling medium passage 92a reaches the first cooling medium passage 92b. The cooling medium then passed through the first cooling medium passage 92b to advance from the center portion of the first portion 16a to the position right below the grooved portion 16A and to reach the second cooling medium passage 92c. In the vertical cooling medium passage 92a and the first cooling medium passage 92b, the temperature of the cooling medium is not substantially increased since the cooling medium and the susceptor 15 do not contact each other.

The cooling medium having reached the inlet of the second cooling medium passage 92c advances so as to depict a semicircle below the groove 16A' and reaches a third cooling medium passage 92d, which is a passage extending from a position right below the grooved portion 16A to the center of the first portion 16a. The cooling medium having advanced through the third cooling medium passage 92d reaches a vertical cooling medium passage 92e, which provides a vertical cooling medium passage in plate part 16 and the slide shaft 18, similarly to the vertical cooling medium passage 92a. The cooling medium flows downward through the vertical cooling medium passage 92e to be discharged to the outside. A heat transfer inhibiting part for hindering heat transfer between the cooling medium and the plate part 16 and between the cooling medium and the slide shaft 18 is provided in the third cooling medium passage 92d and the vertical cooling medium passage 92e, as is that in the vertical cooling medium passage 92a and the first cooling medium passage 92b. In the third cooling medium passage 92d and the vertical cooling medium passages 92e, therefore, substantially no increase in temperature of the cooling medium occurs as a result of passage of the cooling medium through the third cooling medium passage 92d and the vertical cooling medium passages 92e.

Thus, the cooling medium passage 92 is provided for cooling through a semicircular region right below the grooved portion 16A provided in annular form as viewed in plan.

The cooling medium temperatures at "inflow portions" or positions at which the cooling medium enters the second cooling medium passages 91c and 92c from the first cooling medium passages 91b and 92b are lower than the cooling medium temperatures at "outflow portions" or positions at which the cooling medium flows into the third cooling medium passages 91d and 92d from the second cooling medium passages 91c and 92c. This means that if the two inflow portions are close to each other, the portion right below the grooved portion 16A cannot be cooled uniformly. In the ninth embodiment of the present invention, therefore, two inflow portions are distanced apart from each other. More specifically, the two inflow portions are provided so that a line connecting the two inflow portions passes through the center of the first portion 16a. If the cooling medium in the second cooling medium passage 91c is caused to flow clockwise, the cooling medium in the second cooling medium passage 92c is also caused to flow clockwise. If the cooling medium in the second cooling medium passage 91c is caused to flow counterclockwise, the cooling medium in the second cooling medium passage 92c is also caused to flow counterclockwise. That is, the directions of flows of the cooling medium in the second cooling medium passage 91c and 92c are set coincident with each other.

In the susceptor according to the ninth embodiment of the present invention, the cooling device 90 for cooling the portion of the plate part 16 right below the groove 16A' is provided, so that heat conduction between the first portion 16a and the second portion 16b through the portion right below the groove 16A' can be inhibited. As a result, a difference in temperature can be created in the substrate more definitely than that in the first embodiment.

Figure 15:
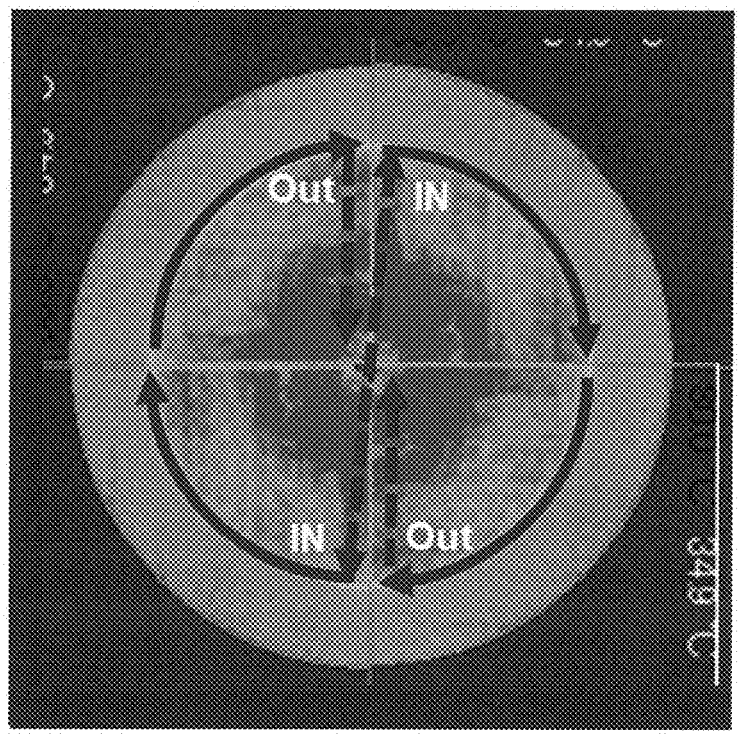
FIG. 15 is an image showing a temperature distribution in the surface of the susceptor.

FIG. 15 is an image showing a temperature distribution in the surface of the susceptor 15 according to the ninth embodiment of the present invention. Solid-line arrows and broken-line arrows indicate the directions of flows of the cooling medium. From this image, it can be understood that a definite temperature difference was created between the first portion 16a and the second portion 16b.

Figure 16:
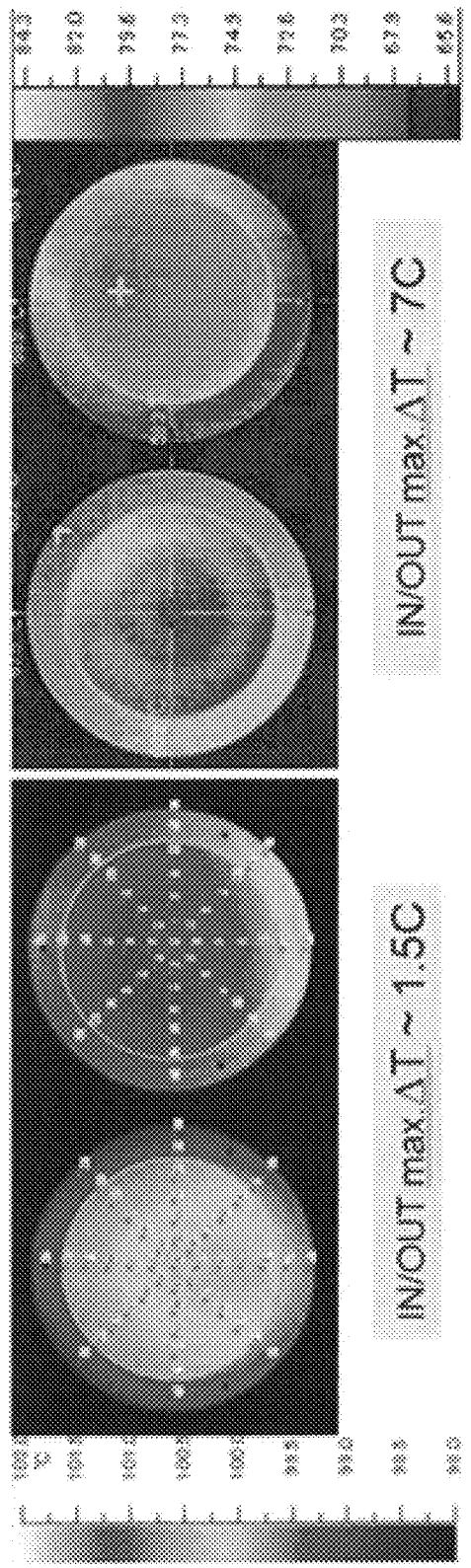
FIG. 16 is diagram showing variations in the temperature distribution on the susceptor.

FIG. 16 is a diagram showing variations in the temperature distribution on the susceptor depending on the existence/nonexistence of the cooling device. Two images shown with "without cooling device" are images showing a temperature distributions in the surface of a susceptor according to a comparative example formed by removing the cooling device from the construction shown in FIG. 13. Two images shown with "with cooling device" are images each showing a temperature distribution in the surface of the susceptor according to the ninth embodiment of the present invention. The susceptor was cooled by using water at a flow rate of 0.4 l/min as a cooling medium. In all of the cases of obtaining the temperature distributions shown by the four images, the set temperature was 75 to 100° C., and the temperature settings for the central portion and the outer portion were maximized.

As can be understood from the four images, a definite temperature difference can be created between the inner and outer zones bounded by the grooved portion. While the temperature difference between the central portion and the outer portion in the temperature distributions in the two images shown with "without cooling device" was about 1.5° C. at the maximum, the temperature difference between the central portion and the outer portion in the temperature distributions in the two images obtained by performing cooling was increased to about 7° C. From this result, it can be understood that transfer of heat through the portion right below the groove 16A' can be effectively inhibited by the cooling device 90. Thus, in the ninth embodiment of the present invention, a definite temperature difference can be created between the zones in a low temperature region from about 75 to 100° C. in which the radiation of heat is small and it is difficult to create a temperature difference.

Figure 17:
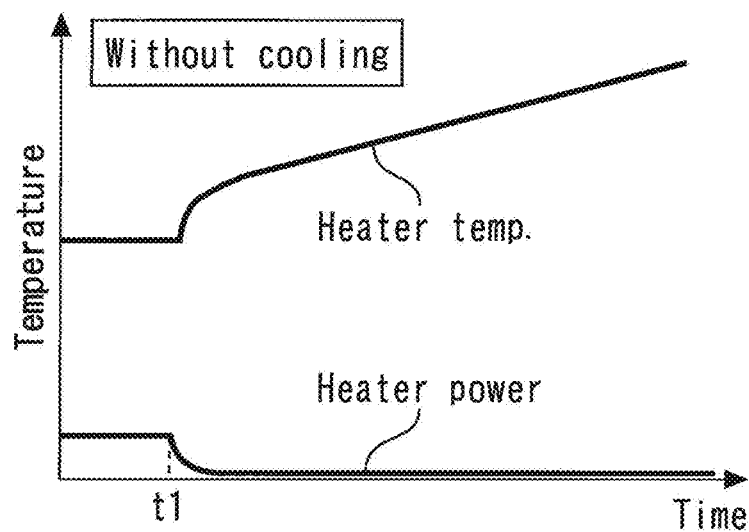
FIG. 17 is a diagram showing change in temperature in a plasma process.

Enabling a low-temperature process with the susceptor according to the ninth embodiment will subsequently be described with reference to FIGS. 17 to 22. FIG. 17 is a diagram showing change in temperature in a plasma process with respect to the susceptor having only the grooved portion and not having the cooling device 90. "Heater power" represents the power to the heaters, and "Heater temp." represents the temperature of the susceptor. In a process accompanied with plasma, the temperature of the susceptor can easily be increased due to the influence of plasma. FIG. 17 shows a state where even after a time t1 at which the heaters are turned off, the temperature of the susceptor continues increasing due to the influence of plasma. If the temperature of the susceptor is increased in this manner, a low temperature process in which the substrate is processed at a low temperature cannot be performed.

Figure 18:
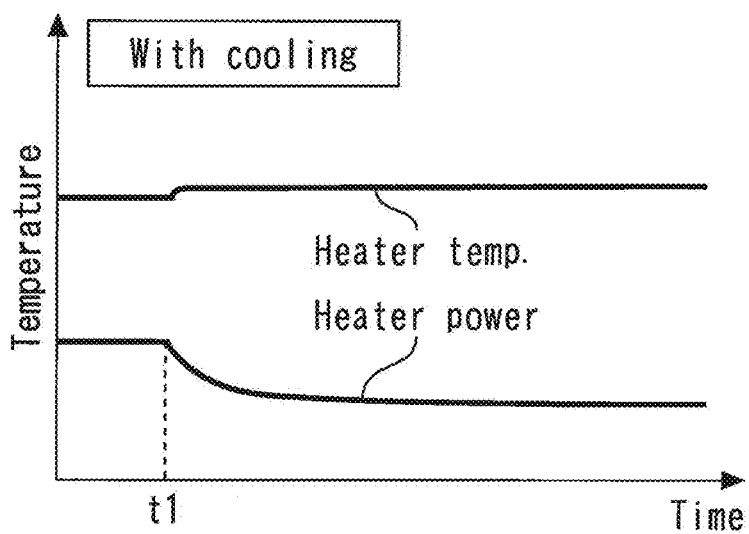
FIG. 18 is a diagram showing change in temperature in a plasma process.

FIG. 18 is a diagram showing change in temperature in a plasma process with respect to the susceptor according to the ninth embodiment of the present invention. Since the susceptor 15 is cooled by the cooling device 90, the heater temperature can be maintained generally constantly while certain currents are being caused to flow through the heaters. The susceptor temperature can therefore be prevented from continuing increasing, thus enabling a low-temperature process.

Figure 19:
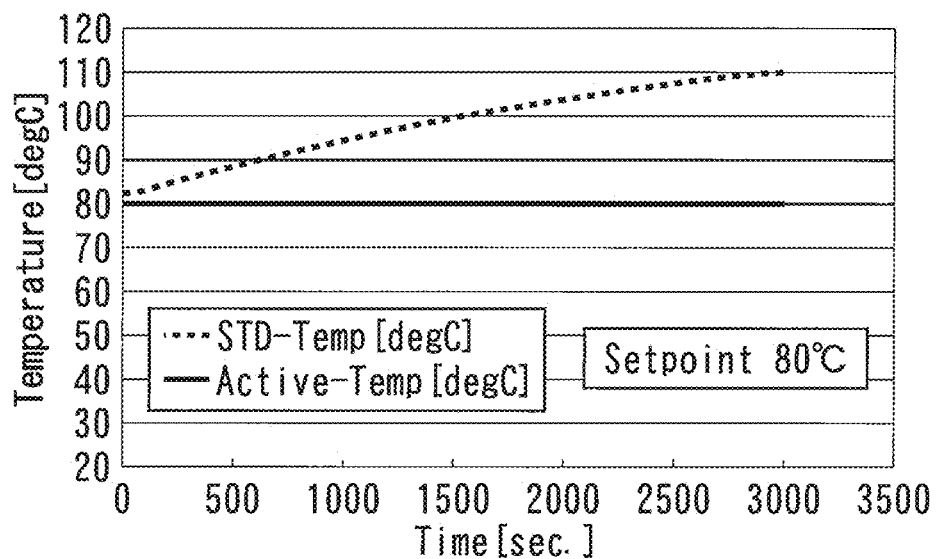
FIG. 19 is a diagram showing a transition in temperature of the susceptor in a plasma process.

FIG. 19 is a diagram showing a transition in temperature of the susceptor in a plasma process when a target temperature of the susceptor was set to 80° C. A broken line indicates a temperature transition when the cooling device 90 was not used, while a solid line indicates a temperature transition when the cooling device 90 was used. It can be understood that the provision of the cooling device 90 enables maintaining the target temperature at 80° C.

Figure 20:
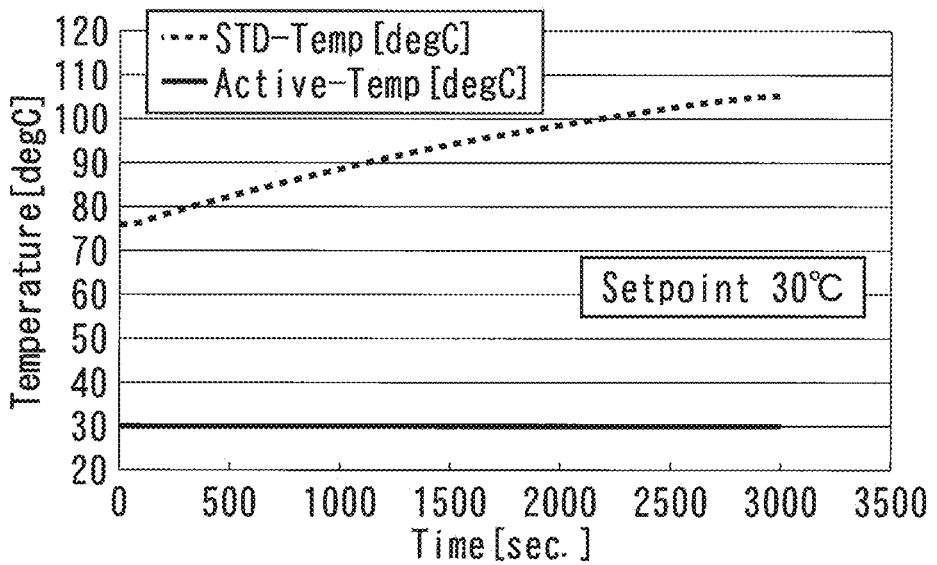
FIG. 20 is a diagram showing a transition in temperature of the susceptor in a plasma process.

FIG. 20 is a diagram showing a transition in temperature of the susceptor in a plasma process when a target temperature of the susceptor was set to 30° C. A broken line indicates a temperature transition when the cooling device 90 was not used, while a solid line indicates a temperature transition when the cooling device 90 was used. The temperature of the susceptor cannot be kept to 30° C. in the process without the cooling device 90. It can be understood that the provision of the cooling device 90 enables maintaining the target temperature 30° C. The data shown in FIGS. 19 and 20 was obtained in a state where the heaters were turned off.

Figure 21:
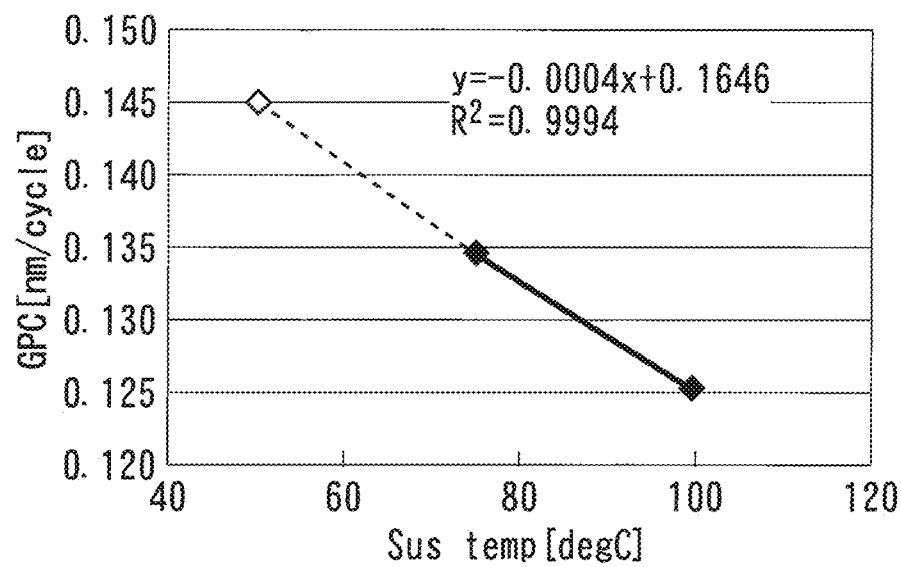
FIG. 21 is a diagram showing changing the growth rate.
Figure 22:
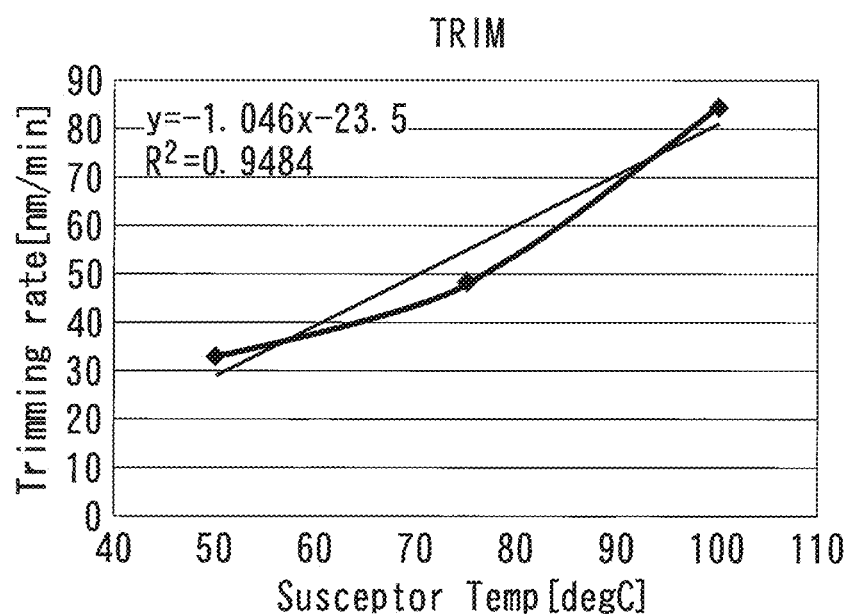
FIG. 22 is a diagram showing changing the etching rate.

Thus, a plasma process can be performed by using the cooling device 90 and by setting the substrate temperature to a low temperature of, for example, about 80° C. or 30° C. The substrate temperature in a plasma process largely influences the film growth speed or the etching speed. FIG. 21 is a diagram showing changing the growth rate (growth rate per cycle) by changing the temperature of the susceptor. FIG. 22 is a diagram showing changing the etching rate by changing the temperature of the susceptor. The desired film growth or etching speed can be achieved by changing the substrate temperature by means of the susceptor 15 according to the ninth embodiment of the present invention.

Various modifications can be made to the susceptor according to the ninth embodiment of the present invention within such a scope as not to lose the features of the susceptor. For example, the number of grooved portions 16A, the shape of each grooved portion 16A and the shapes of the cooling medium passages 91 and 92 can be changed as desired, for example, according to process requirements. While two cooling medium passages each having a first cooling medium passage and a second cooling medium passage are provided in the ninth embodiment, three or more independent cooling medium passages may be provided. Preferably, in such a case, the positions at which the cooling medium enters the second cooling medium passage from the first cooling medium passage are provided generally at equal intervals along the grooved portion 16A.

Tenth Embodiment

Figure 23:
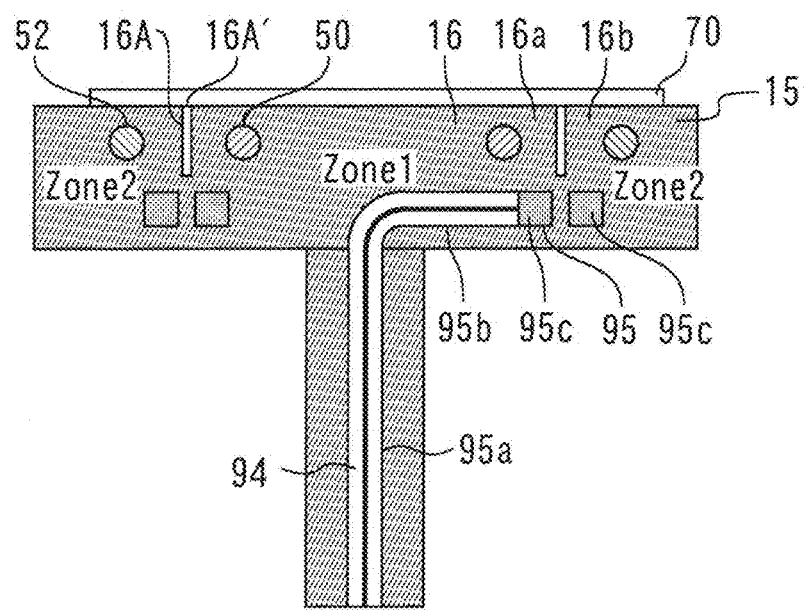
FIG. 23 is a sectional view of a susceptor according to a tenth embodiment.

FIG. 23 is a sectional view of a susceptor according to a tenth embodiment of the present invention. In the ninth embodiment, the second cooling medium passages 91a and 92c of a cooling device 90 are embedded in the plate part 16 right below the groove 16A'. In the tenth embodiment, a second cooling medium passage 95c of the cooling device is embedded in positions on opposite sides of a portion of the plate part 16 right below the groove 16A'. The cooling medium having advanced from a vertical cooling medium passage 95a into a first cooling medium passage 95b makes two rounds through the second cooling medium passage 95c in the plate part 16.

Figure 24:
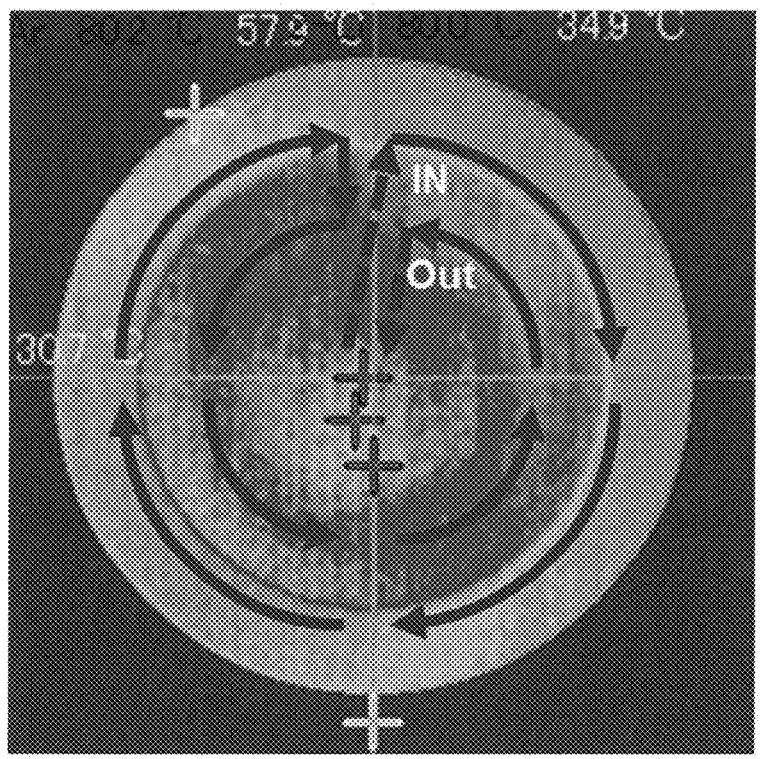
FIG. 24 is an image showing a temperature distribution in the surface of susceptor.

FIG. 24 is an image showing a temperature distribution in the surface of susceptor according to the tenth embodiment of the present invention. Arrows in FIG. 24 indicates the direction of the flow of the cooling medium. First, the cooling medium having passed through the vertical cooling medium passage 95a reaches the first cooling medium passage 95b. The cooling medium then passed through the first cooling medium passage 95b to reach the second cooling medium passage 95c from the center portion of the first portion 16a. The first cooling medium passage is indicated by a broken-line arrow marked with "IN". The second cooling medium passage 95c makes two rounds through the portion below the groove as viewed in plan. Thereafter, the cooling medium is led to the center portion of the first portion 16a by a third cooling medium passage, reaches a vertical cooling medium passage, and is discharged to the outside. The third cooling medium passage is indicated by a broken-line arrow marked with "OUT". In the two vertical cooling medium passages, the first cooling medium passage and the third cooling medium passage, a heat transfer inhibiting part prevent the cooling medium and the susceptor from contacting each other, so that the temperature of the cooling medium is not substantially increased.

Since the second cooling medium passage in the tenth embodiment is provided as to make two rounds along the groove, the cooling medium passage layout is complicated in comparison with that in the cooling device according to the ninth embodiment. However, the effect of inhibiting heat conduction in the plate part 16 right below the groove 16A' can be improved.

Eleventh Embodiment

Figure 25:
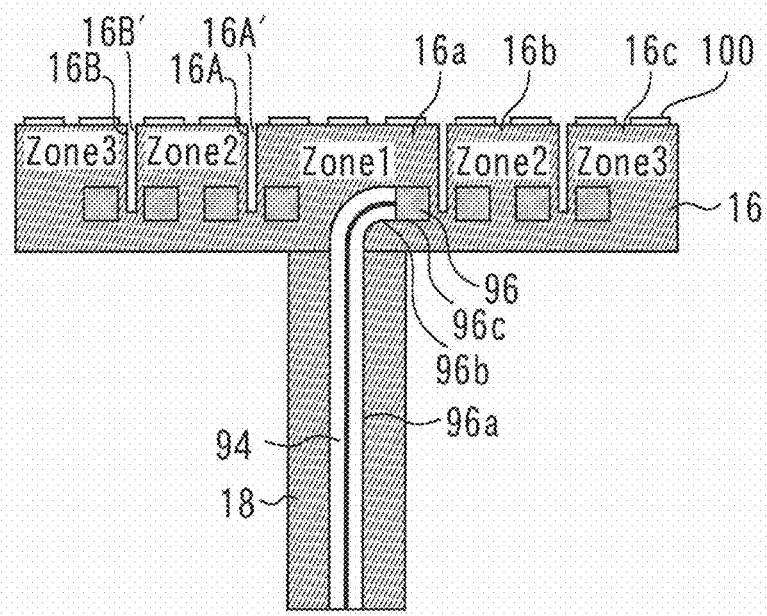
FIG. 25 is a sectional view of a susceptor according to the eleventh embodiment.

FIG. 25 is a sectional view of a susceptor according to the eleventh embodiment. A second cooling medium passage 96c for cooling a portion of the plate part 16 below the groove 16A' is provided so as to make two rounds, and a second cooling medium passage 96c for cooling a portion of the plate part 16 below a groove 16B' is provided so as to make two rounds.

Thin-film heat generating members 100 having upper and lower surfaces interposed between insulating films are provided on the first portion 16a, the second portion 16b and a third portion 16c. The thin-film heat generating members 100 were made by printing a thin-film heat generating member such as tungsten on a thin insulating member and providing a thin insulating member on the thin-film heat generating member. The degree of freedom of shaping the thin-film heat generating members 100 is high and the thin-film heat generating members 100 are easily interchangeable. Therefore a user can flexibly set the temperature of the susceptor.

Twelfth Embodiment

Figure 26:
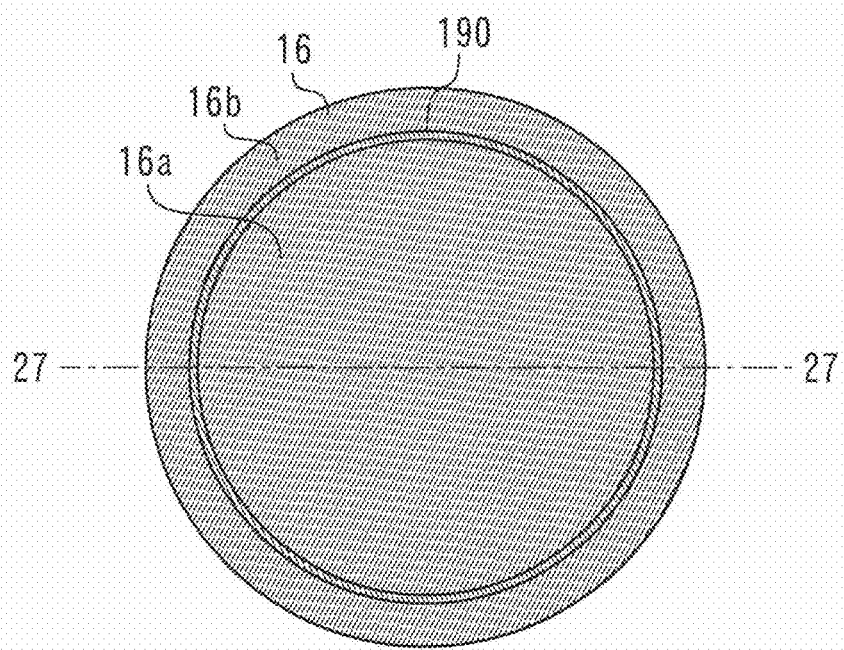
FIG. 26 is a plan view of a susceptor according to the twelfth embodiment.

FIG. 26 is a plan view of a susceptor according to the twelfth embodiment. A heat insulating portion 190 is provided between the first portion 16a and the second portion 16b. The heat insulating portion 190 is a portion lower in heat conductivity than the first portion 16a and the second portion 16b.

Figure 27:
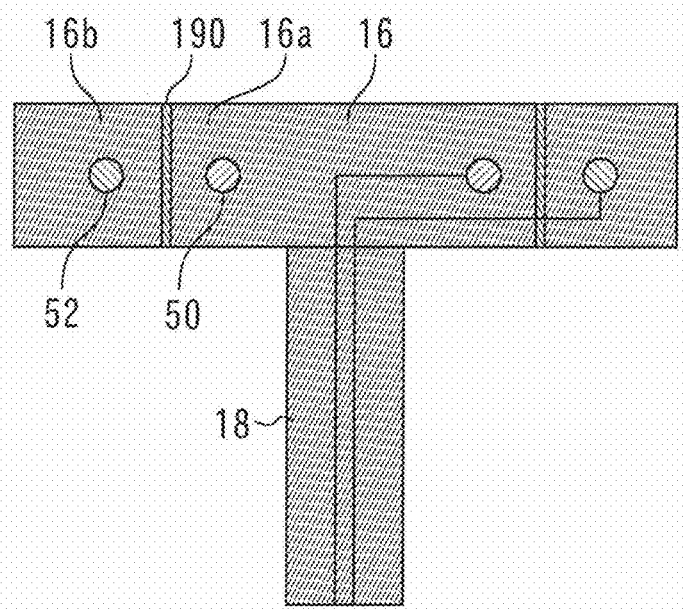
FIG. 27 is a sectional view of the susceptor taken along line 27-27 in FIG. 26.

FIG. 27 is a sectional view of the susceptor taken along line 27-27 in FIG. 26. The upper surface of the heat insulating portion 190, the upper surface of the first portion 16a and the upper surface of the second portion 16b form one flat surface. Because of the existence of the heat insulating portion 190, the first portion 16a and the second portion 16b do not abut on each other.

Figure 28:
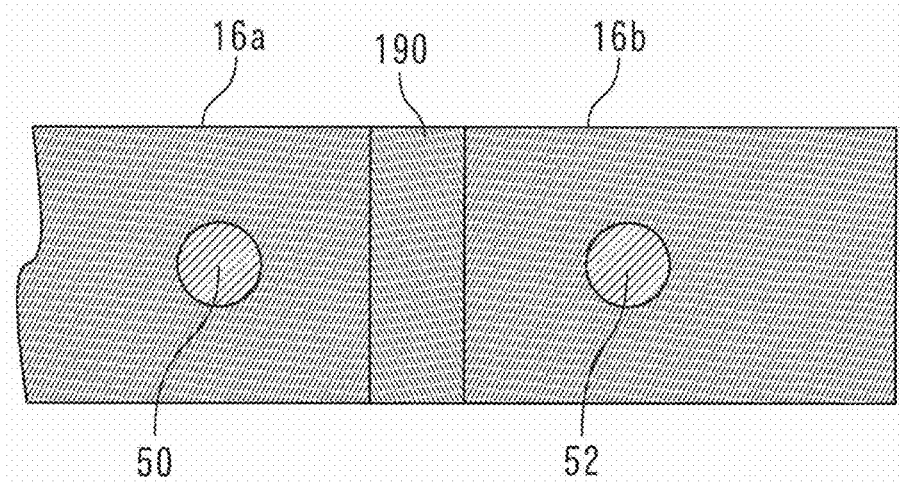
FIG. 28 is an enlarged view of the heat insulating portion.

FIG. 28 is an enlarged view of the heat insulating portion 190. As the material of the heat insulating portion 190, a material lower in heat conductivity than the materials of the first portion 16a and the second portion 16b is used. If the materials of the first portion 16a and the second portion 16b are aluminum, the material of the heat insulating portion 190 is, for example, stainless steel or titanium. If the materials of the first portion 16a and the second portion 16b are aluminum nitride, the material of the heat insulating portion 190 is, for example, quartz. Aluminum oxide may be used as the material of the heat insulating portion 190.

It is preferable to set the thermal expansion coefficients of the heat insulating portion 190, the first portion 16a and the second portion 16b as close as possible. It is also preferable to form the heat insulating portion 190 of a material having a high hardness in order to secure strength of the plate part 16.

The heat insulating portion 190 extends from the upper surface to the lower surface of the plate part 16. Therefore the first portion 16a and the second portion 16b are physically separate from each other. The heat insulating portion 190 functions as a thermal barrier for inhibiting heat conduction between the first portion 16a and the second portion 16b. Since no groove is formed in the plate part 16, the mechanical strength of the plate part 16 can be increased in comparison with the case where the grooved portion exists.

It is thought that when a grooved portion is provided in the plate part, the substrate temperature is minimized right above the groove. However, the problem of a reduction in substrate temperature right above the heat insulating portion 190 can be avoided since the heat insulating portion 190 has a temperature between those of the first portion 16a and the second portion 16b.

Figure 29:
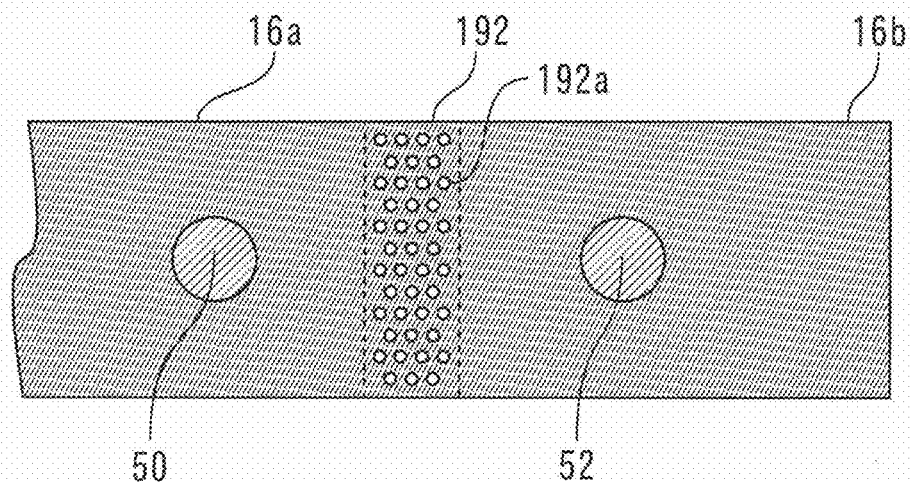
FIG. 29 is a sectional view of a portion of a susceptor according to a modified example.

FIG. 29 is a sectional view of a portion of a susceptor according to a modified example. A heat insulating portion 192, the first portion 16a and the second portion 16b are formed of the same material. A plurality of voids 192a are provided in the heat insulating portion 192. As a result of the provision of the voids 192a, the heat insulating portion 192 is lower in heat conductivity than the first portion 16a and the second portion 16b.

For example, part of aluminum nitride may be evaporated and condensed into a solid by heating aluminum nitride at a high temperature to form the voids 192a in a controlled state. In a case where the susceptor is formed of a ceramic, the voids 192a is formed in a controlled state before forming of a different layer. In either case, the voids 192a are gas bubbles formed in the heat insulating portion 192.

Figure 30:
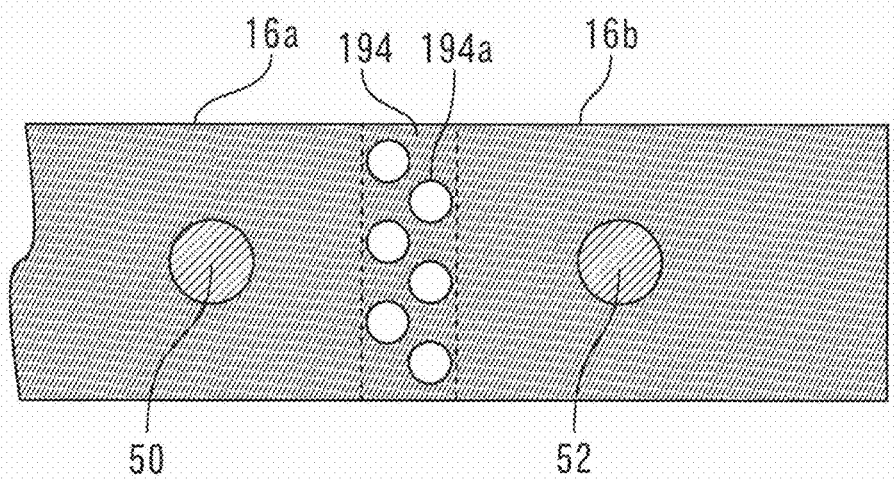
FIG. 30 is a sectional view of a portion of a susceptor according to another modified example.

FIG. 30 is a sectional view of a portion of a susceptor according to another modified example. A heat insulating portion 194, the first portion 16a and the second portion 16b are formed of the same material. A plurality of voids 194a are provided in the heat insulating portion 194. The voids 194a are formed by machining. More specifically, grooves are formed in a plurality of materials, and the plurality of materials are stacked to form the plate part, thus providing the voids 194a. The plurality of materials are joined into one by blazing or sintering heat treatment. A suitable combination of the embodiments described above may be made and used.

Obviously many modifications and variations of the present invention are possible in the light of the above teachings. It is therefore to be understood that within the scope of the appended claims the invention may be practiced otherwise than as specifically described.

What is claimed is:

1. A susceptor comprising:
a plate part;
a first heater configured to heat a first portion of the plate part, wherein the first heater is disposed in the first portion;
a second heater configured to heat a second portion of the plate part, the second portion being different from the first portion, wherein the second heater is disposed in the second portion;
a heat insulating portion configured to thermally insulate the first portion and the second portion from each other on an upper surface side of the plate part, the heat insulating portion including a grooved portion provided in the plate part on the upper surface side, wherein the grooved portion is located between the first heater and the second heater;
a cooling device configured to cool the plate part right below the grooved portion, at least a part of the cooling device extends below the grooved portion;
a first closing part provided on the first portion and a part of the grooved portion to narrow a groove in the grooved portion without contacting the second portion; and
a second closing part provided on the second portion and a part of the grooved portion to narrow the groove in the grooved portion without contacting the first portion and the first closing part.

2. The susceptor according to claim 1, wherein the cooling device is attached to the plate part right below the grooved portion.

3. The susceptor according to claim 1, wherein the cooling device is embedded in the plate part right below a groove in the grooved portion.

4. The susceptor according to claim 3, wherein the second portion surrounds the first portion as viewed in plan, and the cooling device extends along the grooved portion in a plan view.

5. The susceptor according to claim 1, wherein the cooling device is embedded in the plate part at positions on opposite sides of a portion of the plate part below a groove in the grooved portion.

6. The susceptor according to claim 5, wherein the second portion surrounds the first portion in a plan view, and the cooling device extends along the grooved portion in a plan view.

7. The susceptor according to claim 1, wherein the cooling device is embedded in the plate part at positions on opposite sides of the grooved portion.

8. The susceptor according to claim 1, wherein the first heater and the second heater are thin-film heat generating member provided on the plate part.

9. The susceptor according to claim 1, wherein the cooling device has a cooling medium passage through which a cooling medium flows;
   the cooling medium passage includes a first cooling medium passage passing through the first portion, and a second cooling medium passage connecting to the first cooling medium passage and passing through a portion of the plate part right below a groove in the grooved portion;
   a heat transfer inhibiting part for hindering heat transfer between the cooling medium and the plate part is provided in the first cooling medium passage; and
   the cooling medium and the plate part contact each other in the second cooling medium passage.

10. The susceptor according to claim 9, wherein the grooved portion is provided in annular form in a plan view;
   at least two sets of the first cooling medium passage and the second cooling medium passage are provided; and
   positions at which the cooling medium enters the second cooling medium passage from the first cooling medium passage are provided generally at equal intervals along the grooved portion.

11. The susceptor according to claim 1, wherein the grooved portion separates the first portion from the second portion.

12. The susceptor according to claim 1, wherein the first heater is in annular form in the first portion.

13. The susceptor according to claim 1, further comprising a third heater configured to heat a third portion of the plate part, the third portion being different from the first portion and the second portion, wherein the third heater is disposed in the third portion.

14. The susceptor according to claim 13, wherein the third portion comprises an outer edge of the plate part.

15. The susceptor according to claim 1, wherein the susceptor is configured to produce a temperature difference on the upper side surface of the first portion from the upper side surface of the second portion.

* * * * *